United States Patent
Miki

(10) Patent No.: US 6,552,955 B1
(45) Date of Patent: Apr. 22, 2003

(54) SEMICONDUCTOR MEMORY DEVICE WITH REDUCED POWER CONSUMPTION

(75) Inventor: Takeo Miki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/984,464

(22) Filed: Oct. 30, 2001

(51) Int. Cl.[7] ................................................. G11C 8/00
(52) U.S. Cl. ..................................... 365/233; 365/194
(58) Field of Search ............................. 365/233, 194, 365/189.01, 189.08, 227, 233.5

(56) References Cited

U.S. PATENT DOCUMENTS

| | | | |
|---|---|---|---|
| 5,629,897 A | 5/1997 | Iwamoto et al. | 365/195 |
| 5,956,290 A * | 9/1999 | Matsuzaki | 365/233 |
| 6,385,129 B1 * | 5/2002 | Silvestri | 365/233 |
| 6,426,900 B1 * | 7/2002 | Maruyama et al. | 365/194 |
| 6,438,067 B2 * | 8/2002 | Kuge et al. | 365/233 |

FOREIGN PATENT DOCUMENTS

| | | |
|---|---|---|
| JP | 8-147967 | 6/1996 |
| JP | 10-198590 | 7/1998 |
| JP | 2000-30456 | 1/2000 |

* cited by examiner

*Primary Examiner*—Tan T. Nguyen
(74) *Attorney, Agent, or Firm*—McDermott, Will & Emery

(57) ABSTRACT

In a semiconductor memory device including a DLL circuit, a control logic includes a mode register, a command decoder, and a control signal generating unit outputting an output control signal of the DLL circuit. The control signal generating unit selects one of an ACT command and a READ command as a trigger for starting output of a clock, in accordance with a /CAS latency. When the /CAS latency is larger than a certain value, the READ command is used as the trigger. Output of the DLL clock can be stopped for a period from the input of the ACT command until the input of the READ command, so that power consumption can be reduced.

16 Claims, 21 Drawing Sheets

SEMICONDUCTOR MEMORY DEVICE WITH REDUCED POWER CONSUMPTION

BACKGROUND OF THE INVENTION

1. Field of the Invention

The present invention relates to a semiconductor memory device, and more particularly, to a semiconductor memory device including a delay locked loop circuit.

2. Description of the Background Art

In recent years, as semiconductor memory devices operate with higher speed, some dynamic random access memories (DRAMs) such as a Direct Rambus DRAM (D-RDRAM) (R) or a double data rate synchronous DRAM (DDR SDRAM) have a delay locked loop (DLL) circuit mounted therein to realize high-speed operation.

However, with the DLL mounted, consumption current is disadvantageously increased. Some products such as portable terminals, e.g. notebook-sized personal computers or PDAs (Personal Digital Assistants) strongly require low power consumption. Thus, it has been a challenge to reduce power consumption in a semiconductor memory device.

SUMMARY OF THE INVENTION

An object of the present invention is to provide a semiconductor memory device having reduced power consumption while it operates at a high speed.

According to one aspect of the present invention, a semiconductor memory device includes a memory array, a first output circuit, a DLL circuit, and a control circuit.

The memory array includes memory cells arranged in a matrix of rows and columns. The first output circuit outputs a first output signal to outside the semiconductor memory device in synchronization with a first clock signal, in response to data reading from the memory array. The DLL circuit receives and delays an external clock signal, and generates the first clock signal. The control circuit makes the DLL circuit activate the first clock signal in accordance with a control signal from outside the semiconductor memory device.

According to another aspect of the present invention, a semiconductor memory device includes a memory array, a data output circuit and a DLL circuit.

The memory array includes memory cells arranged in a matrix of rows and columns. The data output circuit receives read data from the memory array and outputs the received data to outside the semiconductor memory device in synchronization with an internal clock signal. The DLL circuit receives and delays an external clock signal, and generates the internal clock signal.

The DLL circuit includes a delay line receiving the external clock signal and delaying the received signal for delay time according to a delay control signal, a phase detector detecting a phase difference between an output of the delay line and the external clock signal, a delay control circuit outputting the delay control signal in accordance with an output of the phase detector, and a clock driving circuit activated in accordance with the output of the phase detector and receiving the output of the delay line to output the internal clock signal.

Therefore, a main advantage of the present invention is that the output of the DLL circuit is driven as required, so that power consumption can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 20 is an operation waveform illustrating the operation of DLL circuit 8a;

DESCRIPTION OF THE PREFERRED EMBODIMENTS

Figure 1:
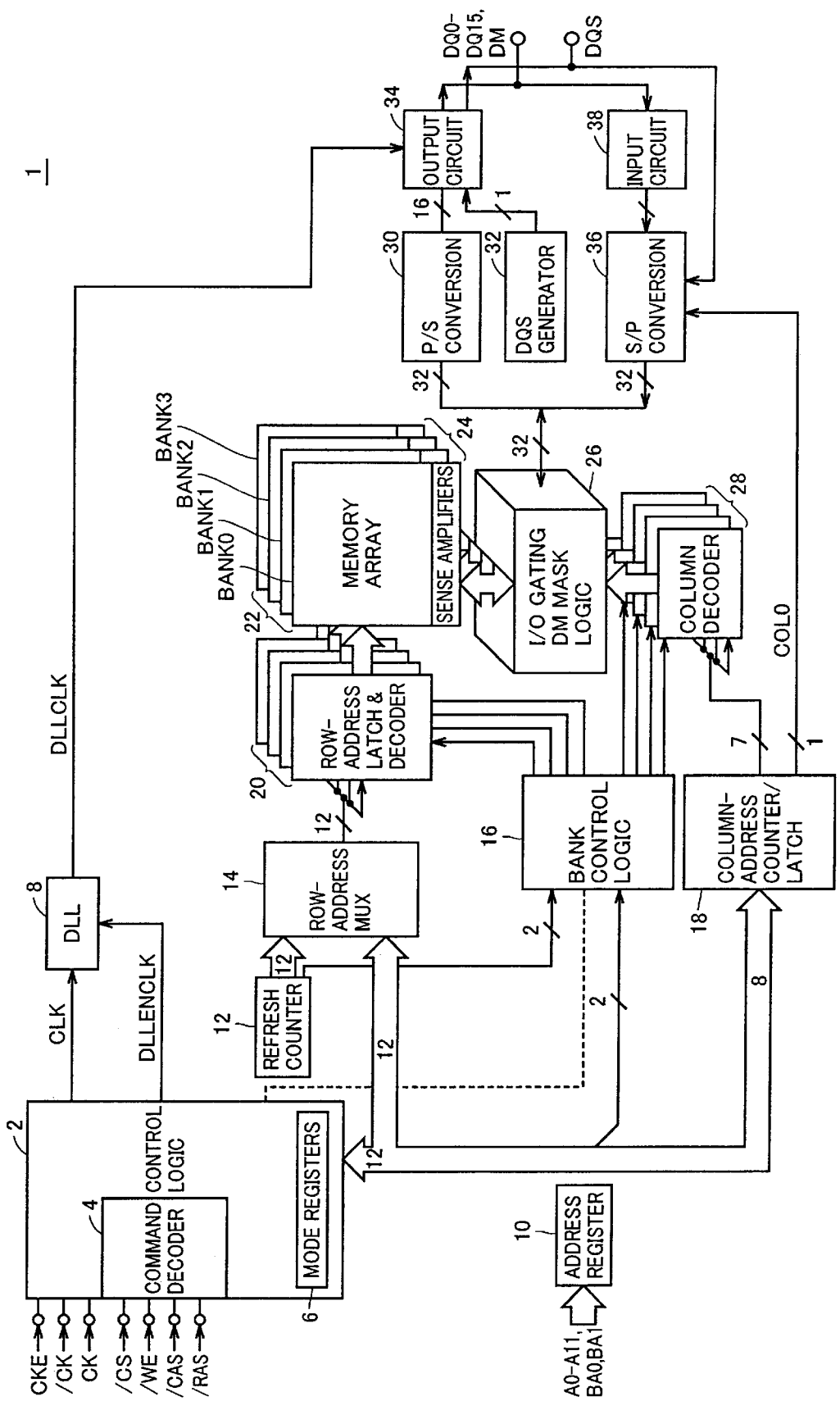
FIG. 1 is a block diagram showing the entire configuration of a semiconductor memory device according to the present invention.

Embodiments of the present invention will be described below in detail with reference to the drawings. It is noted that the same reference characters in the drawings denote the same or corresponding portions.

First Embodiment

FIG. 1 is a block diagram showing the entire configuration of a semiconductor memory device according to the present invention.

Referring to FIG. 1, a semiconductor memory device 1 includes a control logic 2 receiving a clock signal and a control signal from the outside; an address register 10 receiving address signals A0 to A11 and bank address signals BA0, BA1 from the outside; and a DLL circuit 8 receiving a clock signal CLK and a control signal DLLEN-CLK from control logic 2 and outputting a clock signal DLLCLK.

Control logic 2 includes a command decoder 4 receiving control signals /CS, /WE, /CAS, /RAS and detecting a command, and a mode register 6 holding an operation mode of semiconductor memory device 1. Control logic 2 outputs clock signal CLK to DLL circuit 8 based on clock signals CK, /CK and a control signal CKE that are supplied from the outside, and outputs control signal DLLENCLK in accordance with e.g. an output of command decoder 4 and setting of mode register 6.

Semiconductor memory device 1 further includes a refresh counter 12 generating an address at refresh within semiconductor memory device 1; a row-address MUX circuit 14 multiplexing outputs of address register 10 and refresh counter 12 and generating an address for accessing a memory array; a bank control logic 16 selecting a bank based on the outputs of refresh counter 12 and address register 10, and a column-address counter/latch 18 outputting a column address in accordance with an output of address register 10.

Semiconductor memory device 1 further includes a row-address latch & decoder 20 receiving a row address from row-address MUX circuit 14 and receiving a bank selection signal from bank control logic 16; a column decoder 28 receiving a column address of 7 bits from column-address counter/latch 18 and decoding the column address; an I/O gating DM mask logic 26 receiving an output of column decoder 28; a memory array 22 from which a row is selected in accordance with an output of row decoder 20; and a sense amplifier 24 outputting an output of memory array 22 to logic 26.

It is noted that four each of row-address latch & decoder 20, column decoder 28, memory array 22 and sense amplifier 24 are provided to correspond to each of four banks BANK 0 to BANK 3.

Semiconductor memory device 1 further includes a P/S conversion circuit 30 receiving 32-bit data from logic 26 and performing parallel-to-serial conversion to output 16-bit data; a DQS generator 32 generating a strobe signal DQS at data reading; and an output circuit 34 receiving outputs of P/S conversion circuit 30 and DQS generator 32 and outputting data signals DQ0 to DQ15, DM, and DQS in synchronization with clock signal DLLCLK.

Semiconductor memory device 1 further includes an input circuit 38 receiving externally-input data signals DQ0 to DQ15 and data mask signal DM; and an S/P conversion circuit 36 capturing an output of input circuit 38 in synchronization with strobe signal DQS, and further receiving a signal COL0 from column-address counter/latch 18, to perform serial-to-parallel conversion.

Figure 2:
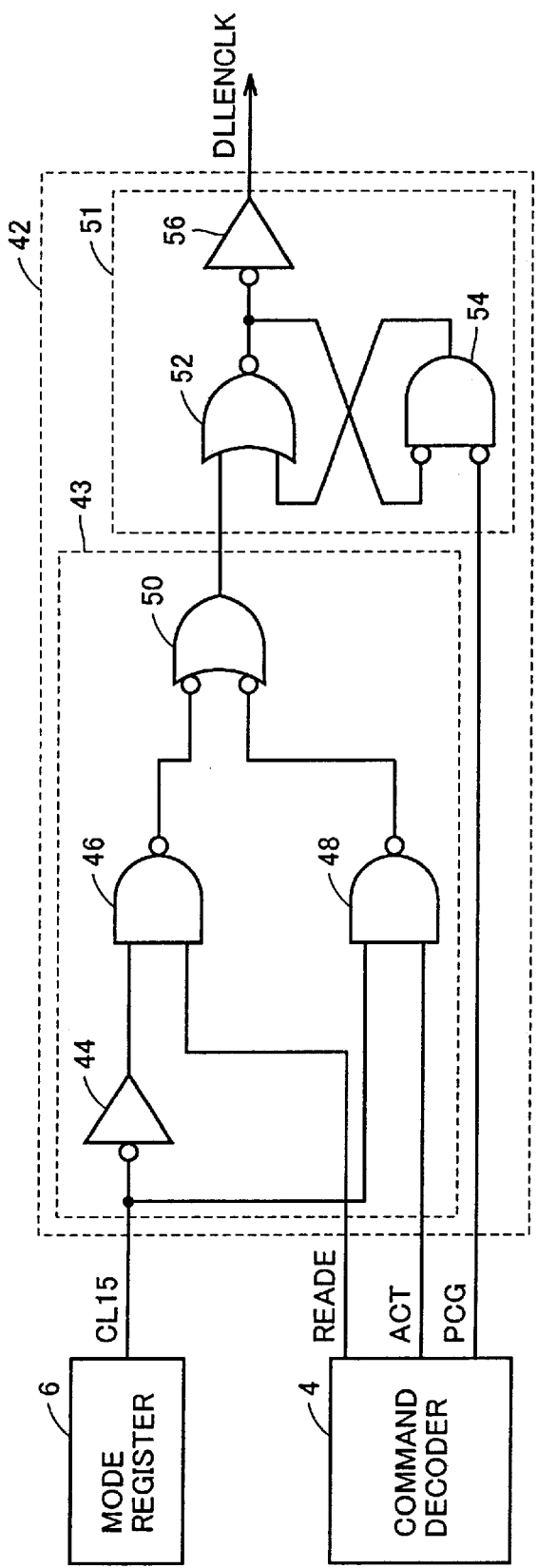
FIG. 2 is a circuit diagram showing a portion of a control logic 2 shown in FIG. 1.

FIG. 2 is a circuit diagram showing a portion of control logic 2 shown in FIG. 1.

Referring to FIG. 2, control logic 2 includes a mode register 6 holding an operation mode of semiconductor memory device 1; a command decoder 4 decoding an externally-applied control signal and detecting a command; and a control signal generating unit 42 receiving a signal CL15 output from mode register 6 and signals READE, ACT and PCG output from command decoder 4, and outputting control signal DLLENCLK controlling the DLL circuit.

Signal CL15 is set to be at a logic high or "H" level when the operation mode of semiconductor memory device 1 has a /CAS latency of 1.5 clocks. Signals READE, ACT and PCG are signals activated in a pulsive manner, respectively, when a read command, a row activation command and a row inactivation command are applied from the outside.

Control signal generating unit 42 includes a selecting unit 43 selecting any one of signals READE and ACT in accordance with signal CL15; and a latch circuit 51 which is set in accordance with an output of selecting unit 43 and is reset in accordance with signal PCG.

Selecting unit 43 includes an inverter 44 receiving and inverting signal CL15, an NAND circuit 46 receiving an output of inverter 44 and signal READE, an NAND circuit 48 receiving signals CL15 and ACT, and an NAND circuit 50 receiving outputs of NAND circuits 46 and 48.

Latch circuit 51 includes an NOR circuit 52 receiving an output of NAND circuit 50 at one input thereof; and NOR circuit 54 receiving an output of NOR circuit 52 and signal PCG; and an inverter 56 receiving and inverting the output of NOR circuit 52 to output control signal DLLENCLK. It is noted that the other input of NOR circuit 52 receives an output of NOR circuit 54.

Figure 3:
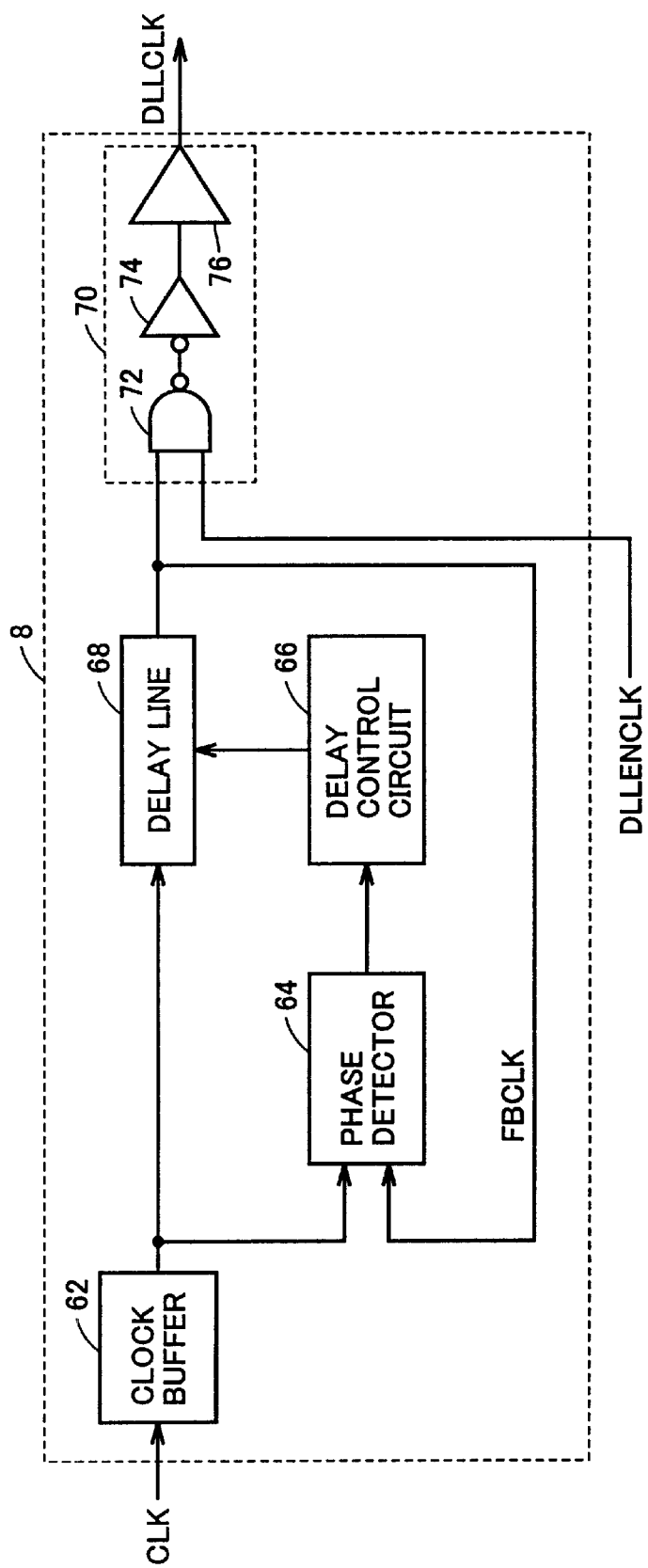
FIG. 3 is a circuit diagram showing the configuration of a DLL circuit 8 shown in FIG. 1.

FIG. 3 is a circuit diagram showing the configuration of DLL circuit 8 in FIG. 1.

Referring to FIG. 3, DLL circuit 8 includes a clock buffer 62 receiving clock signal CLK, a delay line 68 delaying an output of clock buffer 62 for a predetermined delay time period to output a clock signal FBCLK, a phase detector 64 detecting a phase difference between the output of clock buffer 62 and signal FBCLK, and a delay control circuit 66 increasing or decreasing the delay caused by delay line 68 in accordance with an output of phase detector 64.

DLL circuit 8 further includes a clock driving circuit 70 receiving clock signal FBCLK and control signal DLLEN-CLK and outputting clock signal DLLCLK for synchronizing with output signals. Clock driving circuit 70 includes an NAND circuit 72 receiving clock signal FBCLK and control signal DLLENCLK, an inverter 74 receiving and inverting an output of NAND circuit 72, and a buffer circuit 76 amplifying an output of inverter 74 and outputting clock signal DLLCLK.

The operation is now briefly described. The conventional DLL circuit started the operation when a power-supply voltage was supplied to the semiconductor memory device and clock signals CK, /CK were externally input, and output a clock signal DLLCLK towards output circuit 34. However, in a semiconductor memory device, particularly in a DDR SDRAM, clock signal DLLCLK is used only at a part of the circuit operation. Thus, it is unnecessary for the DLL circuit to constantly output clock signal DLLCLK used in a periphery circuit or an output circuit, though lock operation of frequency must be maintained. Therefore, as will be described below, clock driving circuit 70 is activated only during the period in which clock signal DLLCLK is required. This can reduce power consumption associated with driving of a clock line having a large parasitic capacitance and performing signal transmission in a long distance.

Specifically, an example of DDR SDRAM is shown, where timing at which outputting of clock signal DLLCLK is started is controlled in accordance with /CAS latency to allow reduction of power consumption.

Figure 4:
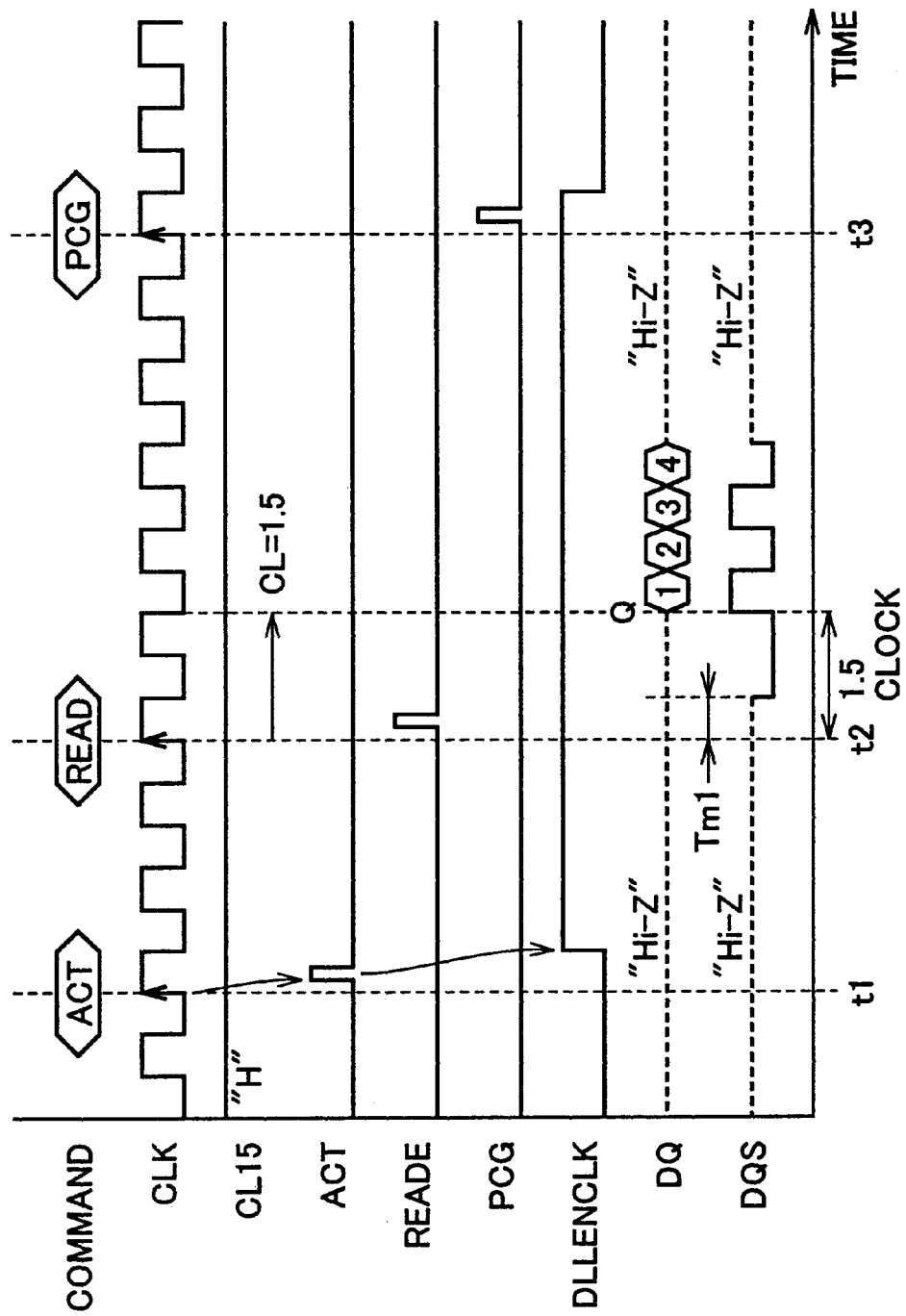
FIG. 4 is an operation waveform showing the operation in the case where a /CAS latency is set as 1.5 clocks.

FIG. 4 is an operation waveform showing the operation in the case where /CAS latency is set as 1.5 clocks.

Referring to FIGS. 2 and 4, when command ACT is applied at time t1, command decoder 4 makes a signal ACT generate a pulse. Signal CL15 is at the H level, since /CAS latency is set as 1.5 clocks. Thus, selecting unit 43 applies signal ACT to latch circuit 51. Therefore, latch circuit 51 is set in response to signal ACT being activated. This activates control signal DLLENCLK from a logic low or "L" level to the H level.

Subsequently, command READ is applied at time t2. Accordingly, command decoder 4 activates signal READE in a pulsive manner. However, when /CAS latency is set as 1.5 clocks, selecting unit 43 does not transmit signal READE to latch circuit 51. Thus, no change occurs in the contents held in latch circuit 51 at that moment.

The /CAS latency is set as 1.5 clocks, so that data output starts after 1.5 clocks from time t2. Then, preamble operation of strobe signal DQS is required prior to the output of data. The /CAS latency of 1.5 clocks provides a small margin Tm1 from reception of the read command until output of the preamble of strobe signal DQS is started. Thus, control signal DLLENCLK is activated in accordance with command ACK to prepare for the output of the preamble of strobe signal DQS.

Figure 5:
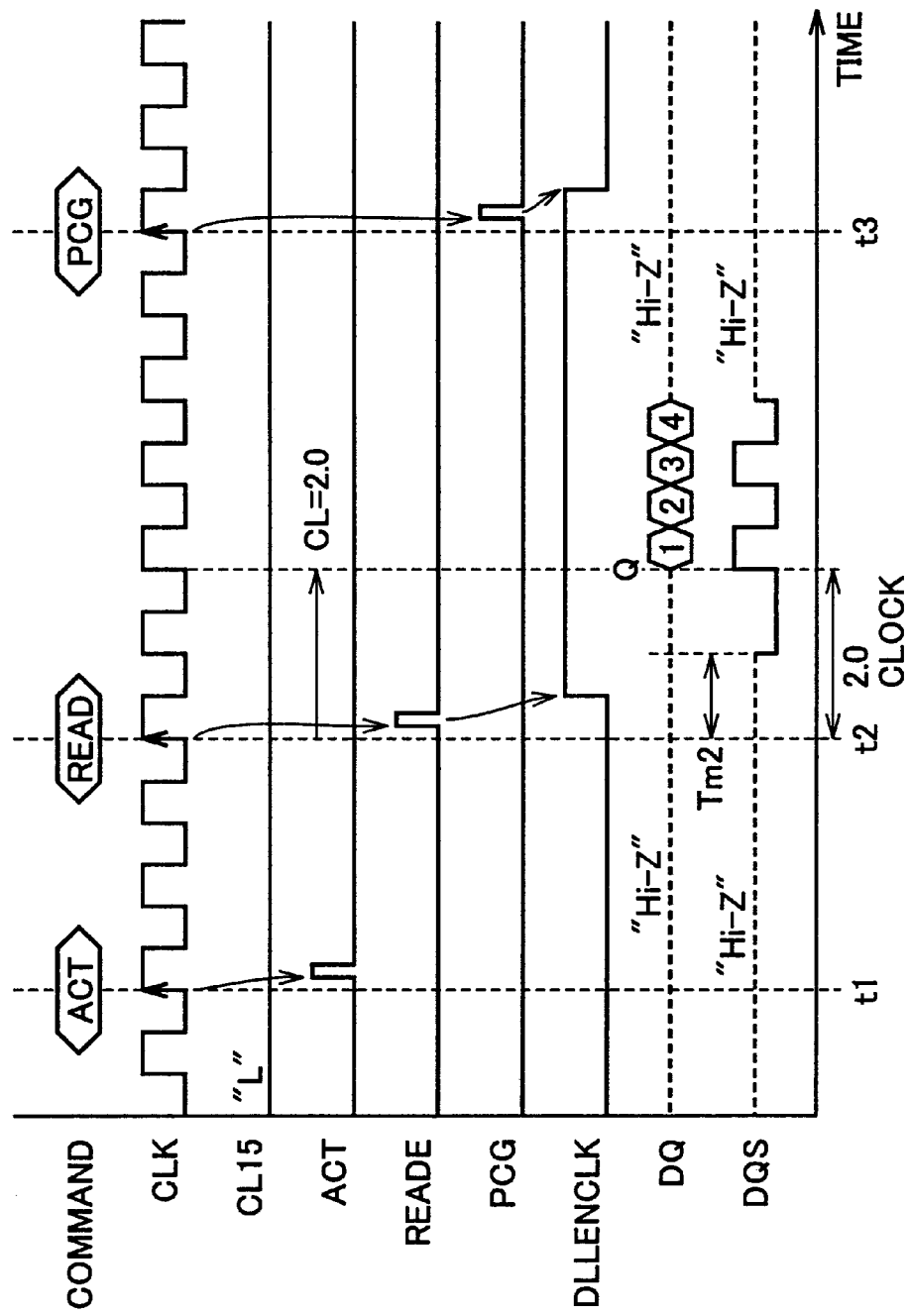
FIG. 5 is an operation waveform illustrating the operation in the case where the /CAS latency is set as 2.0 clocks.

FIG. 5 is an operation waveform illustrating the operation in the case where the /CAS latency is 2.0 clocks.

Referring to FIGS. 2 and 5, when the /CAS latency is larger than 1.5 clocks, signal CL15 is set to be at the L level. Although the /CAS latency is shown as 2.0 in FIG. 5, a similar control can be performed with the /CAS latency of, for example, 2.5 clocks.

Command ACT is input at time t1, and signal ACT is activated in a pulsive manner. However, selecting unit 43 does not transmit the signal to latch circuit 51, so that no change occurs in the state of the latch circuit, and thus control signal DLLENCLK remains at L level.

When command READ is input at time t2, command decoder 4 activates signal READE in a pulsive manner. Signal CL15 is at the L level, so that selecting unit 43 transmits signal READE to latch circuit 51. Thus, latch circuit 51 is set in accordance with signal READE activated in a pulsive manner, and control signal DLLENCLK is activated from the L level to the H level. When the /CAS latency is 2.0 clocks, data output is commenced after 2.0 clocks from time t2. Preamble operation of signal DQS is performed prior thereto, in which a margin Tm2 is larger than margin Tm1 shown in FIG. 4. Therefore, control signal DLLENCLK is activated in response to an input of command READ at time t2 to have sufficient time for outputting the preamble.

When row inactivation command PCG is input at time t3, signal PCG is activated in a pulsive manner and latch circuit 51 is reset, so that control signal DLLENCLK is set to be at the L level, and clock supply to output circuit 34 is stopped.

As described above, according to the first embodiment, the timing at which the output of the clock supplied from the DLL circuit starts is finely adjusted in accordance with the /CAS latency, so that power consumption can be reduced. Therefore, a semiconductor memory device with reduced power consumption for the use in portable terminals or the like can be provided.

Second Embodiment

Figure 6:
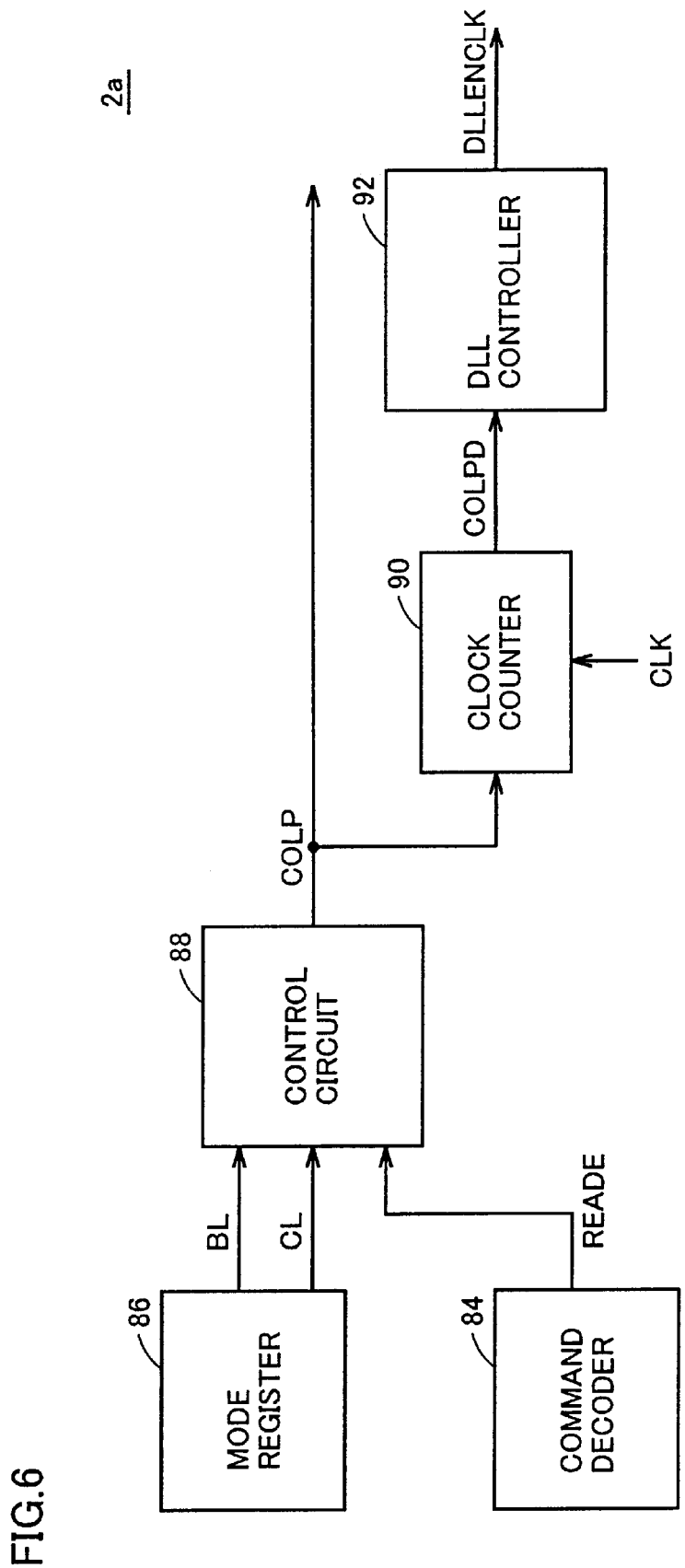
FIG. 6 is a block diagram showing the configuration of a control logic 2a used in the second embodiment.

FIG. 6 is a block diagram showing the configuration of a control logic 2a used in the second embodiment.

Referring to FIG. 6, control logic 2a includes a mode register 86 holding setting of a burst length and a /CAS latency; a command decoder 84 externally receiving a control signal and outputting signal READE in accordance with a read command; a control circuit 88 receiving a signal BL indicating the burst length and a signal CL indicating the /CAS latency from mode register 86, and receiving signal READE from command decoder 84, to output a signal COLP indicating the period for which a column is activated; a clock counter 90 starting to count in synchronization with a clock signal CLK according to signal COLP, and outputting a signal COLPD with an enlarged pulse width; and a DLL controller 92 receiving signal COLPD and outputting a control signal DLLENCLK.

Figure 7:
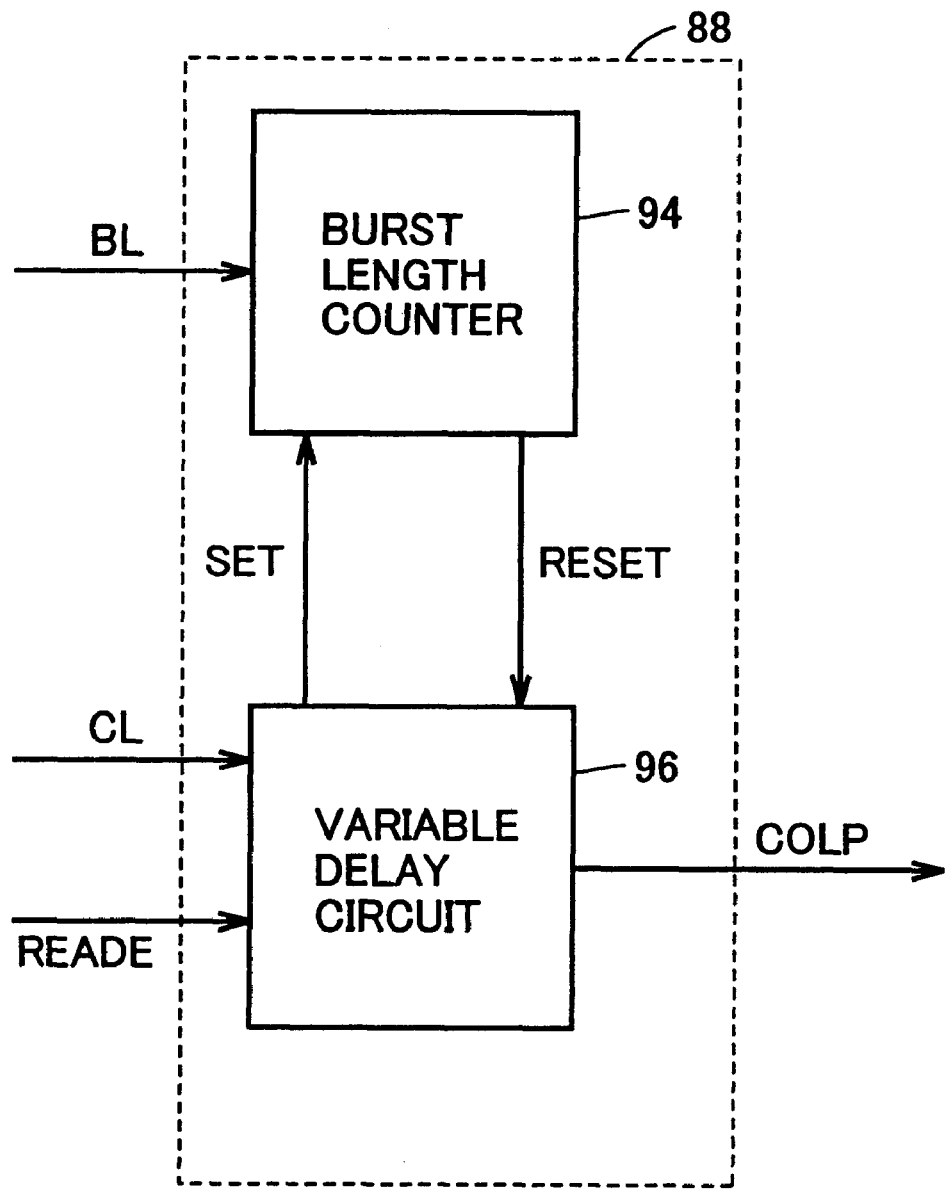
FIG. 7 is a block diagram showing the configuration of a control circuit 88 shown in FIG. 6.

FIG. 7 is a block diagram showing the configuration of control circuit 88 in FIG. 6.

Referring to FIG. 7, control circuit 88 includes a variable delay circuit 96 and a burst length counter 94.

Variable delay circuit 96 first activates signal COLP in accordance with signal READE. Variable delay circuit 96 then outputs a signal SET towards burst length counter 94 after time corresponding to the /CAS latency has elapsed, in accordance with signal CL.

When signal SET is applied, burst length counter 94 starts to count a period corresponding to the burst length determined by signal BL. When the counting of the period is terminated, burst length counter 94 outputs signal RESET towards variable delay circuit 96.

When variable delay circuit 96 receives signal RESET, it inactivates signal COLP. Falling of COLP indicates that the reading from the semiconductor memory device is terminated.

Figure 8:
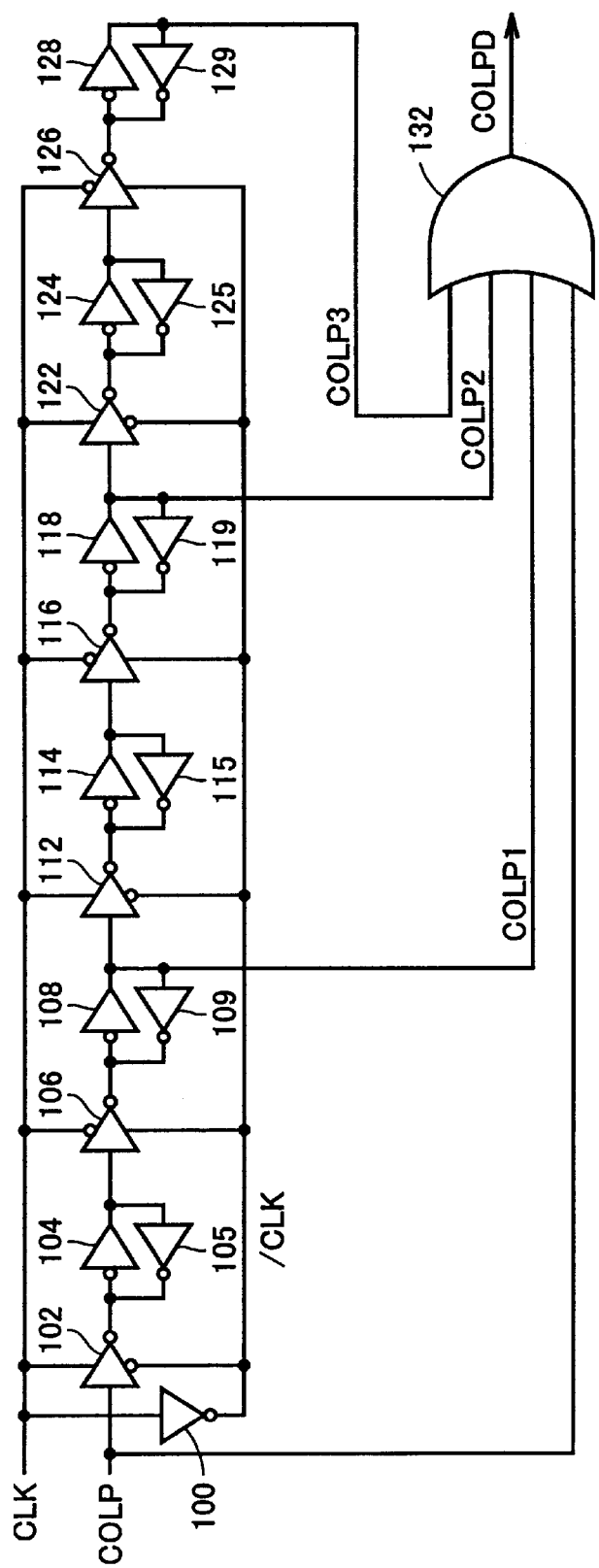
FIG. 8 is a circuit diagram showing the configuration of a clock counter 90 in FIG. 6.

FIG. 8 is a circuit diagram showing the configuration of clock counter 90 in FIG. 6.

Referring to FIG. 8, clock counter 90 includes an inverter 100 receiving and inverting clock signal CLK and outputting clock signal /CLK, a clocked inverter 102 receiving and inverting signal COLP in response to clock signal CLK being activated, an inverter 104 receiving and inverting an output of clocked inverter 102, and an inverter 105 receiving an output of inverter 104 and feeding it back to an input of inverter 104.

Clock counter 90 further includes a clocked inverter 106 receiving and inverting the output of inverter 104 in response to clock signal /CLK being activated, an inverter 108 receiving and inverting an output of clocked inverter 106 and outputting a signal COLP1, and an inverter 109 receiving and inverting signal COLP1 and feeding it back to the input of inverter 108.

Clock counter 90 further includes a clocked inverter 112 receiving and inverting signal COLP1 in response to clock signal CLK being activated, an inverter 114 receiving and inverting an output of clocked inverter 112, and an inverter 115 receiving an output of inverter 114 and feeding it back to the input of inverter 114.

Clock counter 90 further includes a clocked inverter 116 receiving and inverting the output of inverter 114 in response to clock signal /CLK being activated, an inverter 118 receiving and inverting an output of clocked inverter 116 and outputting a signal COLP2, and an inverter 119 receiving and inverting signal COLP2 and feeding it back to the input of inverter 118.

Clock counter 90 further includes a clocked inverter 122 receiving and inverting signal COLP2 in response to clock signal CLK being activated, an inverter 124 receiving and outputting an output of clocked inverter 122, and an inverter 125 receiving the output of inverter 124 and feeding it back to the input of inverter 124.

Clock counter 90 further includes a clocked inverter 126 receiving and inverting the output of inverter 124 in response to clock signal /CLK being activated, an inverter 128 receiving and inverting an output of clocked inverter 126 and outputting a signal COLP3, and an inverter 129 receiving and inverting signal COLP3 and feeding it back to the input of inverter 128.

Clock counter 90 further includes an OR circuit 132 receiving signals COLP, COLP1, COLP2 and COLP3, and outputting signal COLPD.

Figure 9:
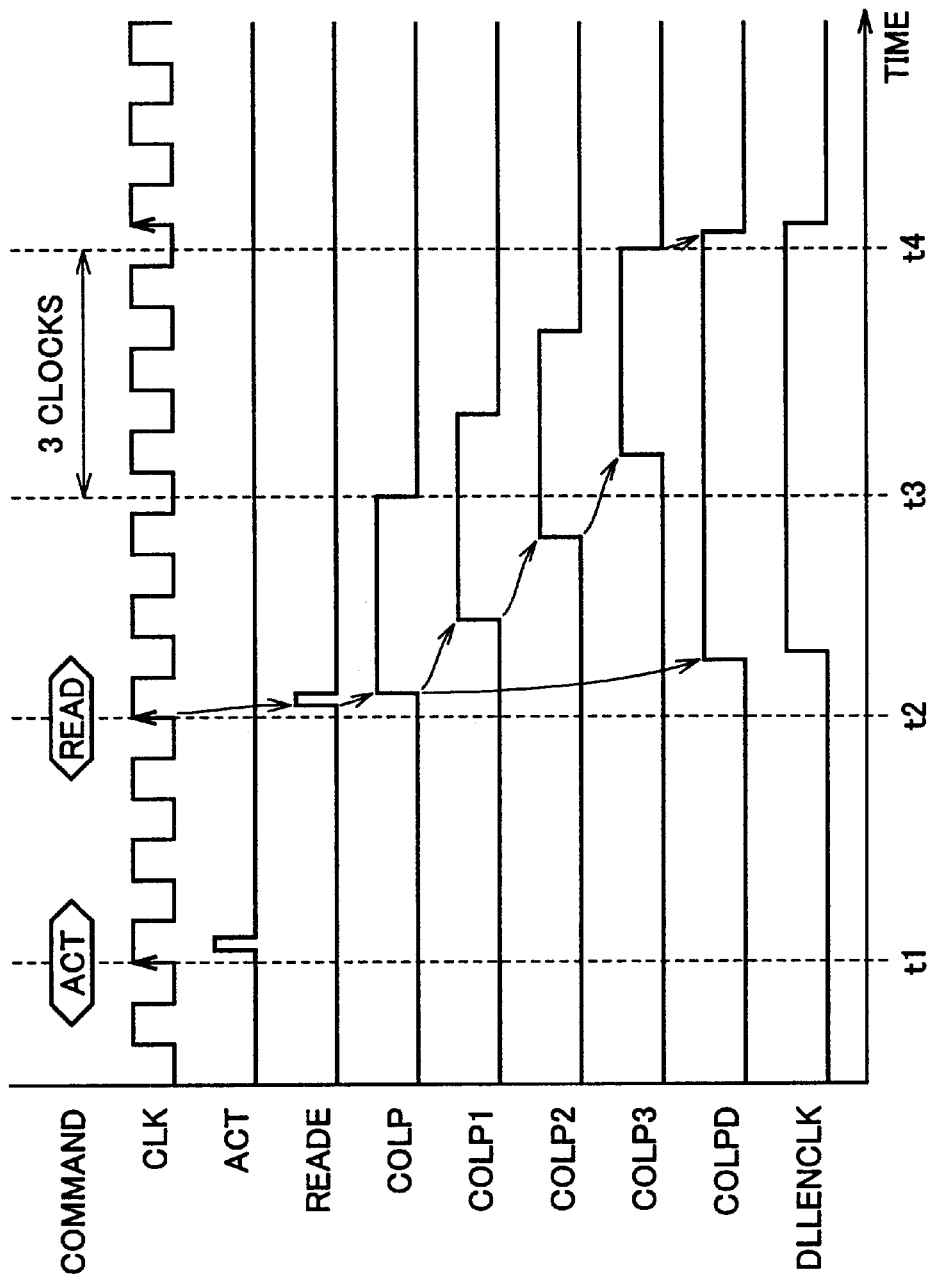
FIG. 9 is an operation waveform illustrating the operation of clock counter 90 in FIG. 8.

FIG. 9 is an operation waveform illustrating the operation of clock counter 90 shown in FIG. 8.

Referring to FIGS. 8 and 9, a command ACT is input at time t1. Subsequently, when command READ is input at time t2, command decoder 84 activates signal READE in a pulsive manner.

Control circuit 88 activates signal COLP to be at the H level until time t3 in response to signal READE being activated. Clock counter 90 generates signal COLP1 which is delayed by one clock from signal COLP, COLP2 which is delayed by two clocks, and COLP3 which is delayed by three clocks, and outputs a logical sum of these signals as signal COLPD. Thus, the falling edge of signal COLP at time t3 is delayed for three clocks, and signal COLPD is lowered from the H level to L level at time t4.

While the first embodiment shows an example in which the operation of DLL circuit is started by commands ACT, READ and stopped by PCG, the second embodiment shows an example in which the operation of DLL is stopped when a predetermined number of clocks have elapsed from reception of the read command. Although an example is shown in which the operation of the DLL circuit is stopped to stop generation of clocks after three clocks from time t3 indicating that the reading operation from the memory array is completed, it is not particularly limited to three clocks, and the DLL circuit may stop operating at any time point at which output of data to the outside is completed.

Third Embodiment

Figure 10:
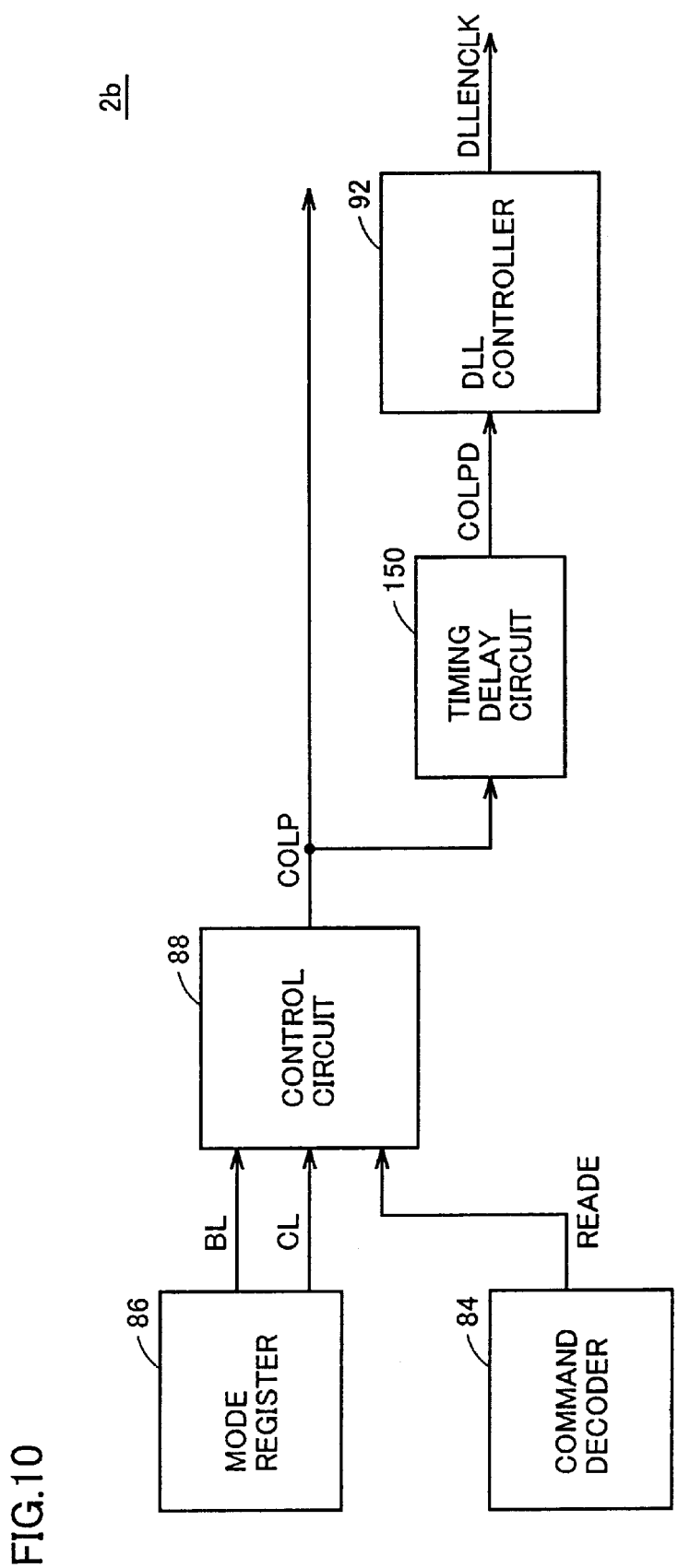
FIG. 10 is a block diagram showing the configuration of a control logic 2b used in the third embodiment.

FIG. 10 is a block diagram showing the configuration of control logic 2b used in the third embodiment.

Referring to FIG. 10, control logic 2b includes a timing delay circuit 150 in place of clock counter 90 in the configuration of control logic 2a described with reference to FIG. 6. The configuration of the other parts is similar to that of controlled logic 2a shown in FIG. 6, so that the description thereof will not be repeated.

Figure 11:
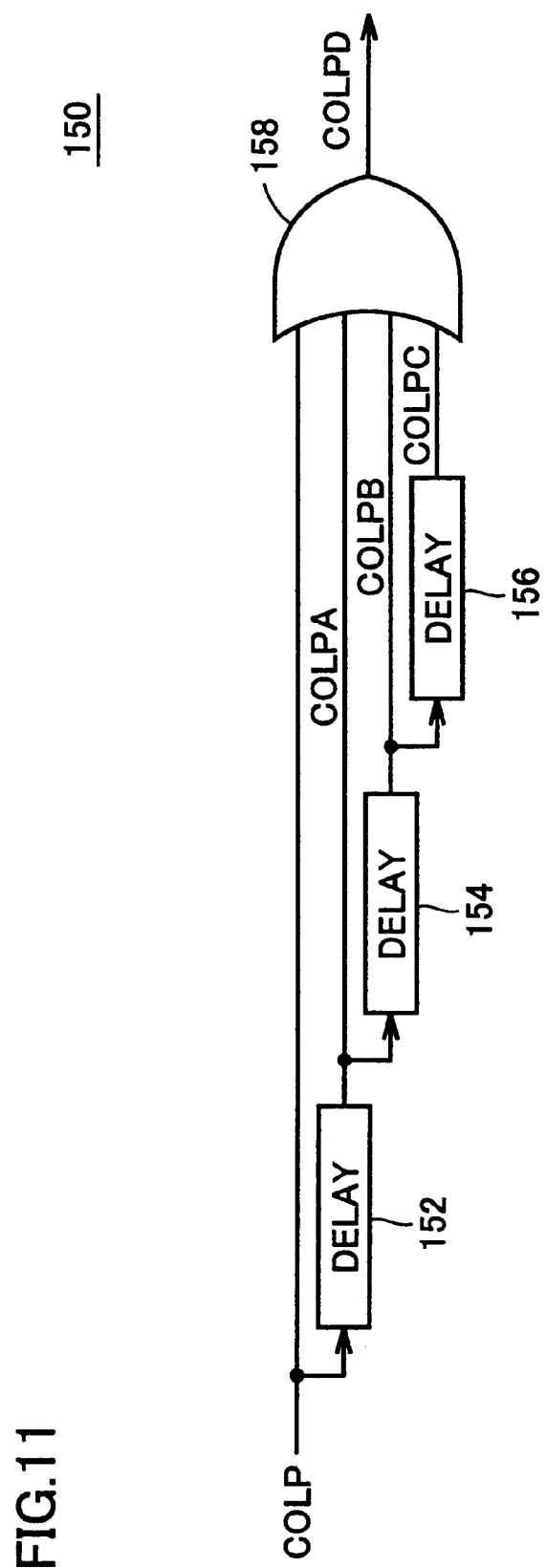
FIG. 11 is a circuit diagram showing the configuration of a timing delay circuit 150 in FIG. 10.

FIG. 11 is a circuit diagram showing the configuration of timing delay circuit 150 in FIG. 10.

Referring to FIG. 11, timing delay circuit 150 includes a delay circuit 152 receiving and delaying signal COLP and outputting a signal COLPA, a delay circuit 154 receiving and further delaying signal COLPA and outputting a signal COLPB, a delay circuit 156 receiving and further delaying signal COLPB and outputting a signal COLPC, and an OR circuit 158 receiving signals COLP, COLPA, COLPB, COLPC and outputting signal COLPD.

Figure 12:
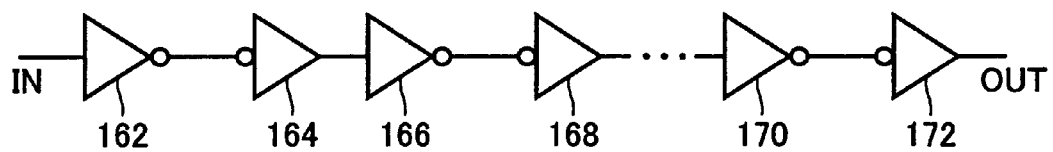
FIG. 12 is a circuit diagram showing the first configuration example of a delay circuit 152 shown in FIG. 11.

FIG. 12 is a circuit diagram showing the first configuration example of delay circuit 152 shown in FIG. 11.

Referring to FIG. 12, delay circuit 152 includes an even number of stages of inverters 162 to 172 connected in series, to receive and output an input signal IN.

It is noted that delay circuits 154 and 156 in FIG. 11 have a similar configuration, so that the description thereof will not be repeated.

Figure 13:
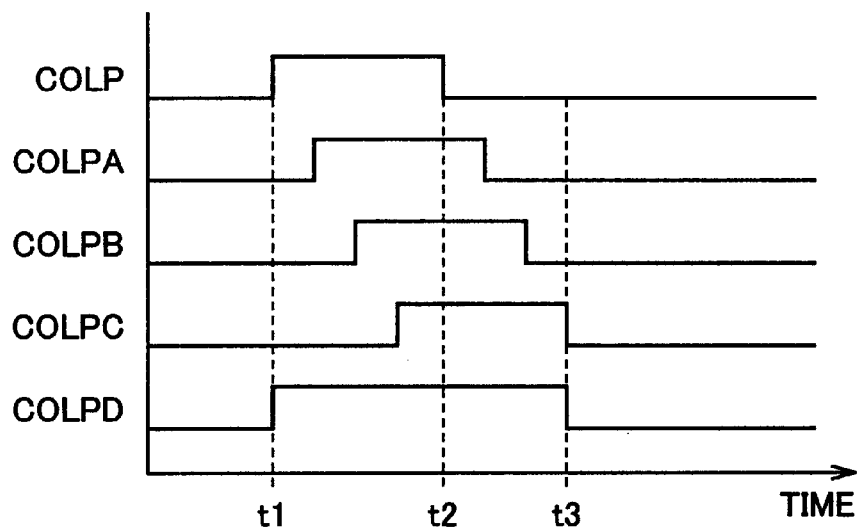
FIG. 13 is an operation waveform illustrating the operation of timing delay circuit 150 shown in FIG. 11.

FIG. 13 is an operation waveform illustrating the operation of timing delay circuit 150 shown in FIG. 11.

Referring to FIGS. 11 and 13, when signal COLP is raised from the H level to L level at time t1, signal COLPD is accordingly raised from the L level to H level. At time t2, signal COLP is lowered from the H level to L level.

Signal COLPA is produced by delaying signal COLP for the delay time of delay circuit 152. Signal COLPB is produced by delaying signal COLPA for the delay time of delay circuit 154. Signal COLPC is produced by further delaying signal COLPB for the delay time of delay circuit 156. Thus, OR circuit 158 obtains the logical sum of these signals, and lowers signal COLPD from the H level to L level at time t3 at which signal COLPC is lowered from the H level to L level.

Therefore, the falling edge of signal COLP is delayed from time t2 to time t3, and thus the pulse width of signal COLPD is enlarged.

As described above, in the third embodiment, the timing at which the pulse is inactivated is delayed for the time corresponding to the delay time of the inverter, in place of clock counter 90 which extends the pulse width clock by clock in the second embodiment. Therefore, according to the third embodiment, as in the case with the second embodiment, the operation of the DLL circuit is stopped after a predetermined period has elapsed to reduce the power consumed at a clock node.

Figure 14:
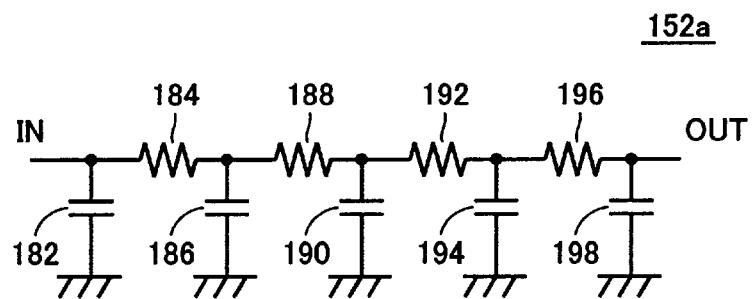
FIG. 14 is a circuit diagram showing the configuration of a delay circuit 152a of the first modification of delay circuit 152.

FIG. 14 is a circuit diagram showing the configuration of a delay circuit 152a which is the first modification of delay circuit 152.

Referring to FIG. 14, delay circuit 152a includes resistances 184, 188, 192 and 196 connected in series between an input node and an output node, a capacitor 182 connected between the input node and a ground node, a capacitor 186 connected between a node connecting resistances 184 and 188 and the ground node, and a capacitor 190 connected between a node connecting resistances 188 and 192 and the ground node, a capacitor 194 connected between a node connecting resistances 192 and 196 and the ground node, and a capacitor 198 connected between the output node of delay circuit 152a and the ground node.

Figure 15:
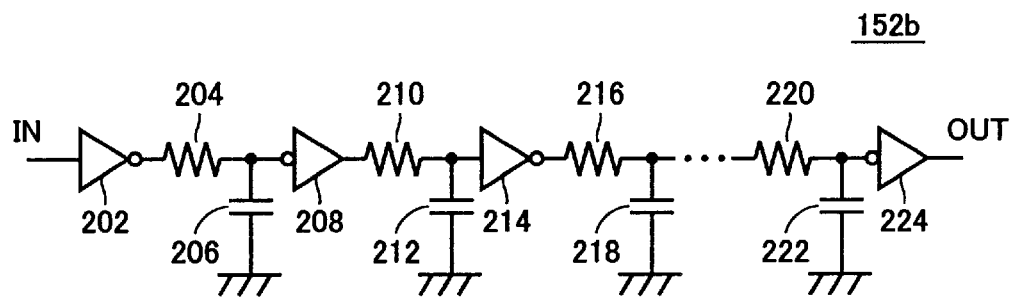
FIG. 15 is a circuit diagram showing the configuration of a delay circuit 152b of the second modification of delay circuit 152.

FIG. 15 is a circuit diagram showing the configuration of a delay circuit 152b which is the second modification of delay circuit 152.

Referring to FIG. 15, delay circuit 152b includes an inverter 202 receiving and inverting input signal IN, a resistance 204 whose one end is connected to an output of inverter 202, a capacitor 206 connected between the other end of resistance 204 and the ground node, an inverter 208 whose input is connected to the other end of resistance 204, a resistance 210 whose one end is connected to an output of inverter 208, a capacitor 212 connected between the other end of resistance 210 and the ground node, an inverter 214 whose input is connected to the other end of resistance 210, a resistance 216 whose one end is connected to an output of inverter 214, and a capacitor 218 connected between the other end of resistance 216 and the ground node.

Delay circuit 152b further includes a resistance 220, a capacitor 222 connected between the other end of resistance 220 and the ground node, and an inverter 224 whose input is connected to the other end of resistance 220 and outputting an output signal OUT.

As shown in FIGS. 12, 14 and 15, delay circuit 152 can delay a signal by a propagation delay of an inverter or by a time constant which depends on the capacity of a capacitor.

Fourth Embodiment

In the fourth embodiment, outputting of clock signal DLLCLK from the DLL circuit is stopped after a predetermined period has elapsed since control signal CLK had been set to be at the L level.

In the conventional DDR SDRAM, as soon as the externally-applied signal CKE was set to be at the L level, signal DLLENCLK controlling the DLL circuit was changed to be at the L level to stop the circuit. However, when the DLL circuit is inactivated at the moment at which signal CKE comes to be at the L level, the circuit immediately stops if, for example, the noise of the L level is applied to a terminal from which control signal CKE is input, resulting in unstable operation.

Figure 16:
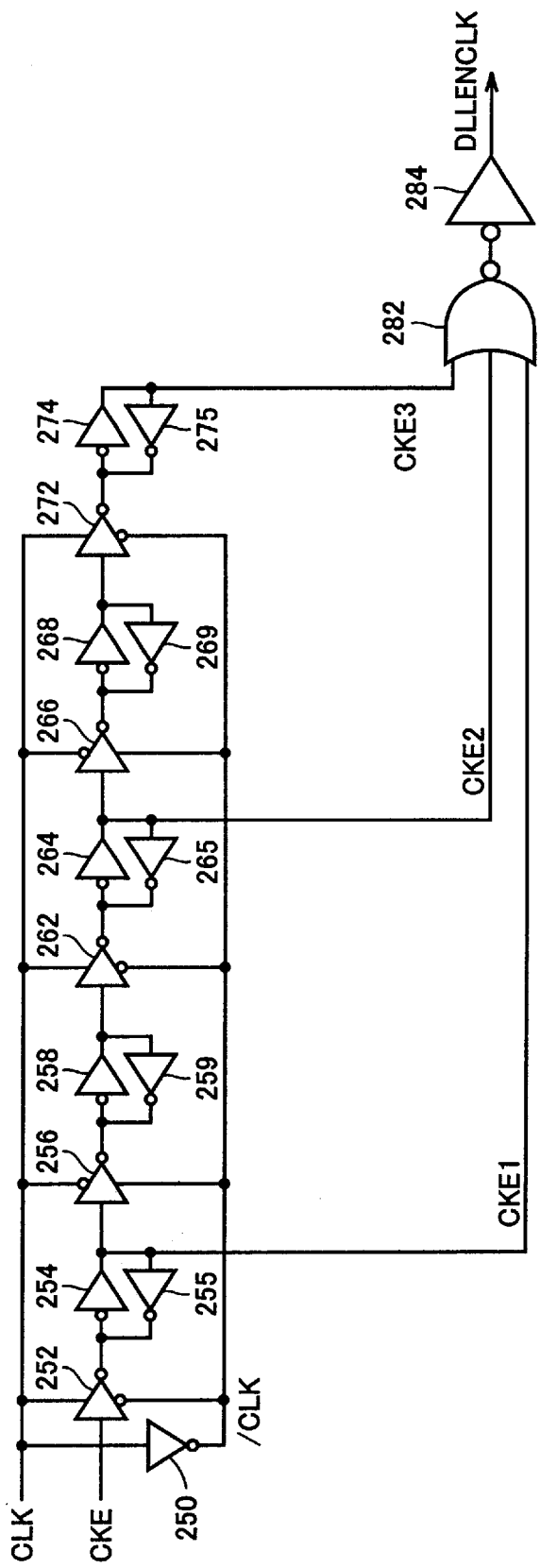
FIG. 16 is a circuit diagram showing the configuration of a control logic 2c used in the fourth embodiment.

FIG. 16 is a circuit diagram showing the configuration of a control logic 2c used in the fourth embodiment.

Referring to FIG. 16, control logic 2c includes an inverter 250 receiving and inverting a clock signal CLK and outputting a clock signal /CLK, a clocked inverter 252 receiving and inverting signal CKE in response to clock signal CLK being activated, an inverter 254 receiving and inverting an output of clocked inverter 252 and outputting a signal CKE1, and an inverter 255 receiving the output of inverter 254 and feeding it back to the input of inverter 254.

Control logic 2c further includes a clocked inverter 256 receiving and inverting the output of inverter 254 in response to clock signal /CLK being activated, an inverter 258 receiving and inverting the output of clocked inverter 256, and inverter 259 receiving and inverting an output of inverter 258 and feeding it back to the input of inverter 258.

Control logic 2c further includes a clocked inverter 262 receiving and inverting the output of inverter 258 in response to clock signal CLK being activated, an inverter 264 receiving and inverting an output of clocked inverter 262 and outputting a signal CKE2, and an inverter 265 receiving the output of inverter 264 and feeding it back to the input of inverter 264.

Control logic 2c further includes a clocked inverter 266 receiving and inverting the output of inverter 264 in response to clock signal /CLK being activated, an inverter 268 receiving and inverting an output of clocked inverter 266, and an inverter 269 receiving and inverting an output of inverter 268 and feeding it back to the input of inverter 268.

Control logic 2c further includes a clocked inverter 272 receiving and inverting the output of inverter 268 in response to clock signal CLK being activated, an inverter 274 receiving and inverting an output of clocked inverter 272 and outputting a signal CKE3, and an inverter 275 receiving the output of inverter 274 and feeding it back to the output of inverter 274.

Control logic 2c further includes an OR circuit 282 receiving signals CKE1, CKE2 and CKE3, and an inverter 284 receiving and inverting an output of OR circuit 282 and outputting control signal DLLENCLK.

Figure 17:
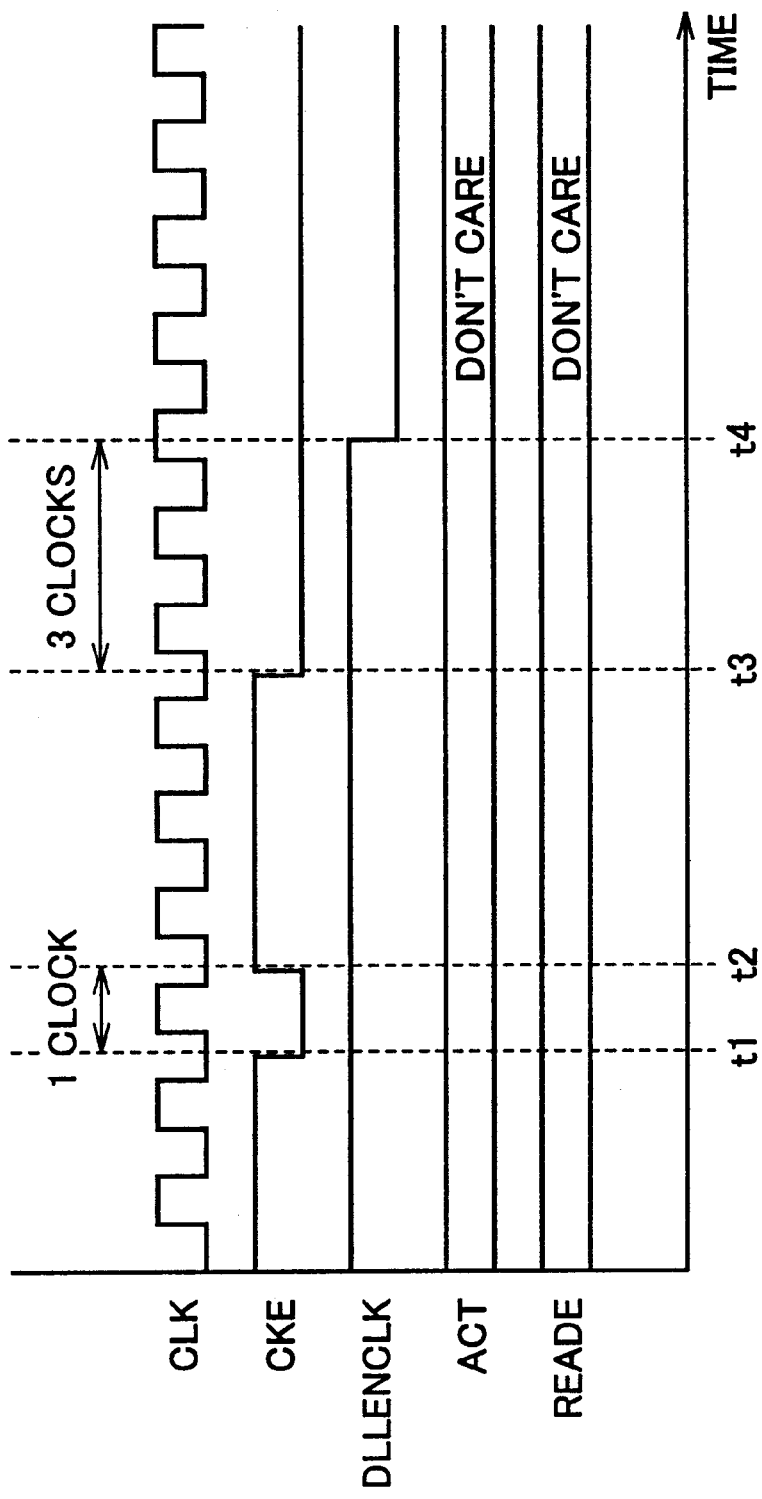
FIG. 17 is an operation waveform illustrating the operation of the third embodiment.

FIG. 17 is an operation waveform illustrating the operation of the third embodiment.

Referring to FIG. 17, it is assumed that a short noise of the L level having a width of e.g. one clock is applied to signal CKE during the period from time t1 to t2. However, signal CKE3 would not be at the L level, preventing DLLENCLK from immediately being inactivated to be at the L level.

When signal CKE3 is lowered to be at the L level after a certain period of time has elapsed, signal CKE1 will have already been at the H level, so that signal DLLENCLK cannot be at the L level after all.

When signal CKE has been at the L level for three or more clocks as in the period from t3 to t4, signals CKE1, CKE2 and CKE3 in FIG. 16 are all set to be at the L level, and therefore control signal DLLENCLK is lowered accordingly from the H level to L level. This is effective for control of the DLL circuit to be stable. It also has an effect such that standby current can also be reduced, since the circuit is basically in a standby state when signal CKE=L.

Fifth Embodiment

In each of the first to fourth embodiments, control signal DLLENCLK was externally applied to the DLL circuit to control activation/inactivation of clock signal DLLCLK. In the fifth embodiment, the DLL circuit controls itself so as not to output clock signal DLLCLK until the clock becomes stable.

Figure 18:
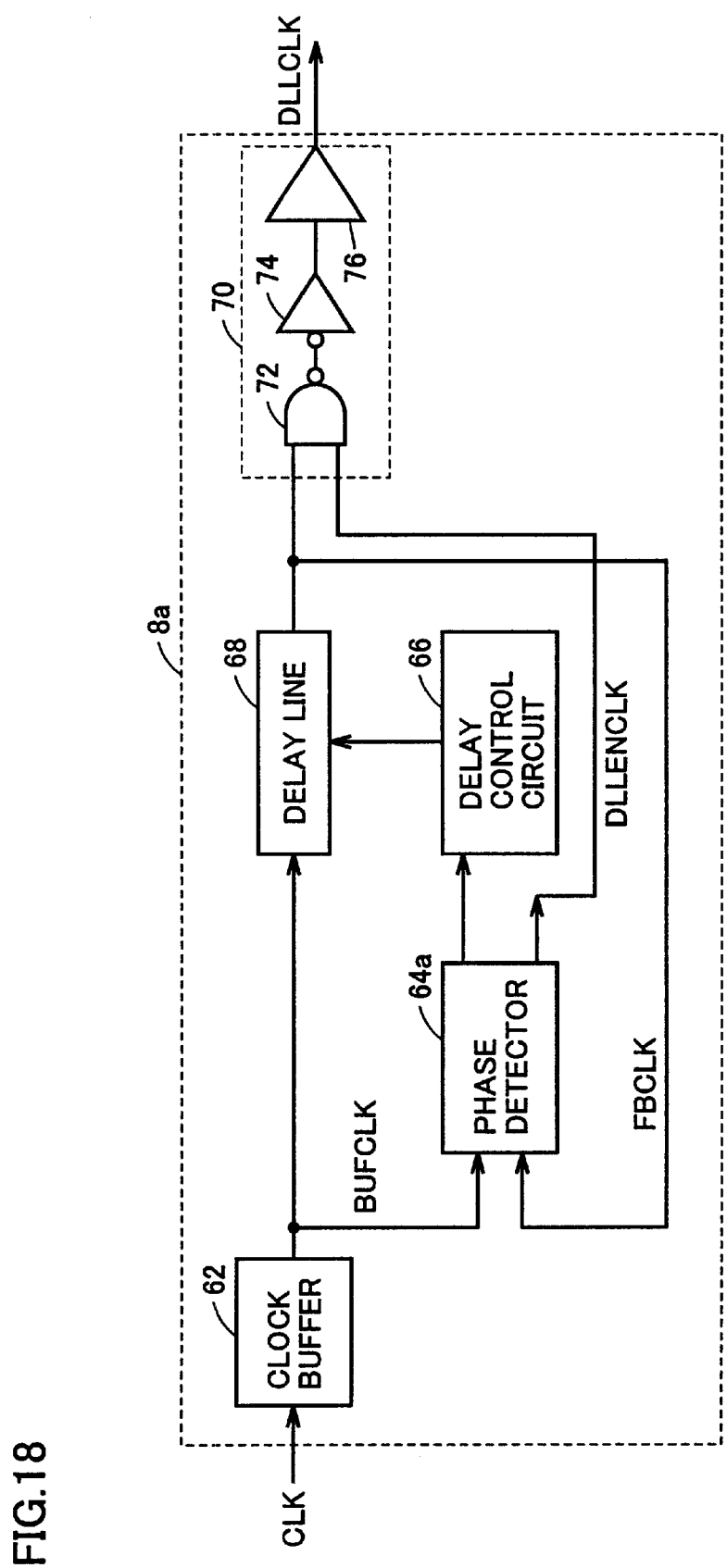
FIG. 18 is a block diagram showing the configuration of a DLL circuit 8a used in the fifth embodiment.

FIG. 18 is a block diagram showing the configuration of a DLL circuit 8a used in the fifth embodiment.

Referring to FIG. 18, DLL circuit 8a includes a phase detector 64a in place of phase detector 64 in the configuration of DLL circuit 8 described with reference to FIG. 3. Phase detector 64a outputs a control signal to delay control circuit 66, and outputs control signal DLLENCLK to clock driving circuit 70. The configuration of the other parts is similar to that of DLL circuit 8 in FIG. 3, so that the description thereof will not be repeated.

Figure 19:
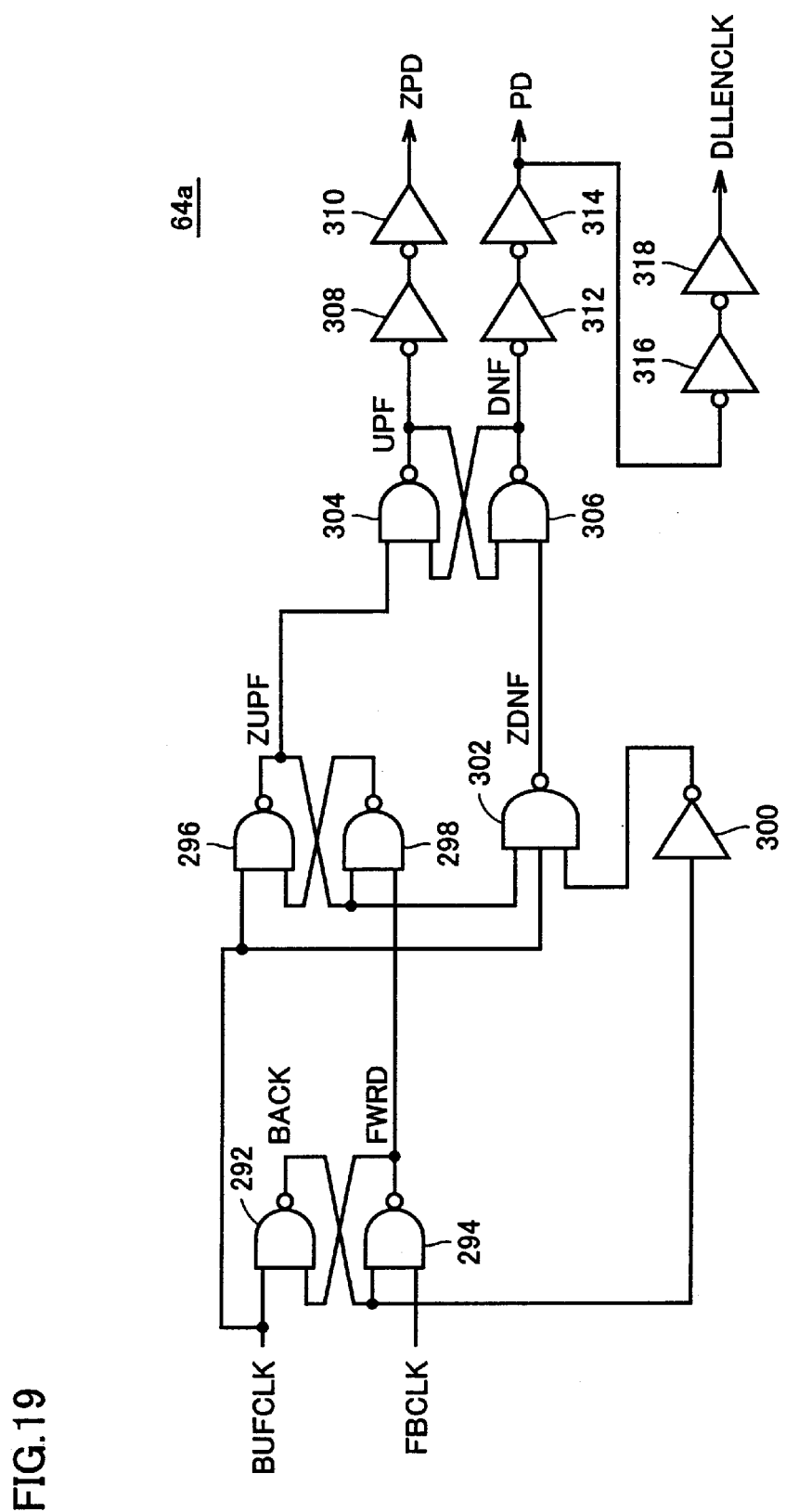
FIG. 19 is a circuit diagram showing the configuration of a phase detector 64a in FIG. 18.

FIG. 19 is a circuit diagram showing the configuration of phase detector 64a in FIG. 18.

Referring to FIG. 19, phase detector 64a includes an NAND circuit 292 receiving a clock signal BUFCLK at one input thereof and outputting a signal BACK, and an NAND circuit 294 receiving signal BACK and clock signal FBCLK and outputting a signal FWRD. Signal FWRD is applied to the other input of NAND circuit 292.

Phase detector 64a further includes an NAND circuit 296 receiving clock signal BUFCLK at one input thereof and outputting a signal ZUPF, and an NAND circuit 298 receiving signal ZUPF and signal FWRD. An output of NAND circuit 298 is applied to the other input of NAND circuit 296.

Phase detector 64a further includes an inverter 300 receiving and inverting signal BACK, and a three-input NAND circuit 302 receiving clock signal BUFCLK, signal ZUPF and an output of inverter 300 and outputting a signal ZDNF.

Phase detector 64a further includes an NAND circuit 304 receiving signal ZUPF at one input thereof and outputting a signal UPF, and an NAND circuit 306 receiving signals UPF and ZDNF and outputting a signal DNF. Signal DNF is applied to the other input of NAND circuit 304.

Phase detector 64a further includes inverters 308, 310 connected in series to receive signal UPF and to output a signal ZPD, inverters 312, 314 connected in series to receive signal DNF and to output a signal PD, and inverters 316, 318 receiving signal PD and outputting control signal DLLENCLK.

Figure 20:
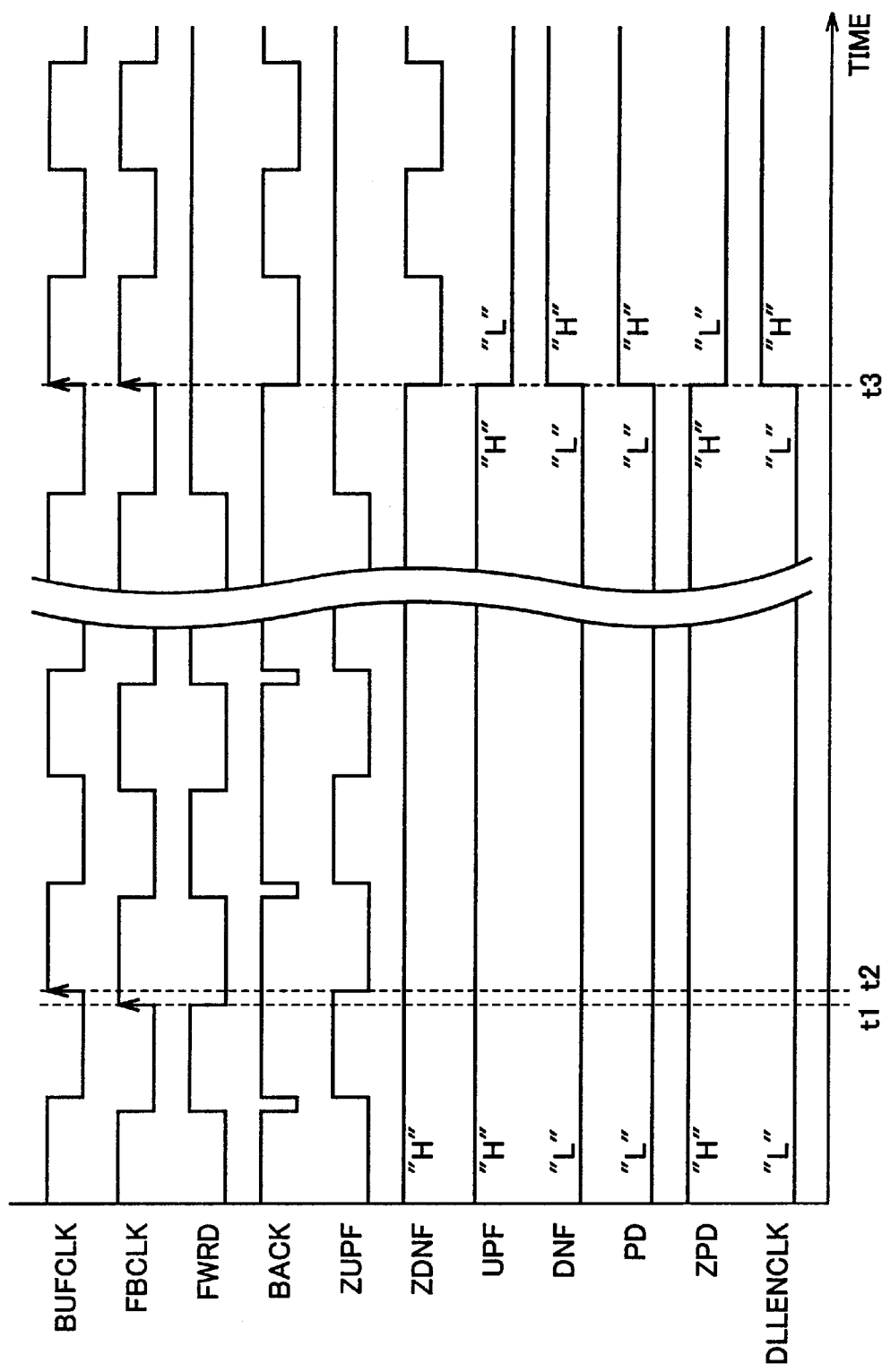

FIG. 20 is an operation waveform illustrating the operation of DLL circuit 8a.

Referring to FIGS. 18 and 20, since phase alignment by the DLL circuit is not sufficient immediately after the power-on, clock signal BUFCLK is raised at time t2 while clock signal FBCLK is raised at time t1. The phase difference is larger than a certain value, so that signal PD is set to be at the L level, indicating no coincidence of the phase. Thus, control signal DLLENCLK is at the L level, and no signal is output form clock driving circuit 70.

After a certain time has elapsed and the phase alignment is successful, the rising edges of clock signals BUFCLK and clock signal FBCLK approximately coincide with each other in the timing as indicated at time t3. Accordingly, signal PD is changed from the L level to the H level which indicates the coincidence has been detected. Hence, control signal DLLENCLK is also changed to the H level, so that clock driving circuit 70 starts outputting clock signal DLLCLK.

Therefore, power consumption can be reduced for a time period until the DLL circuit is locked.

Sixth Embodiment

Figure 21:
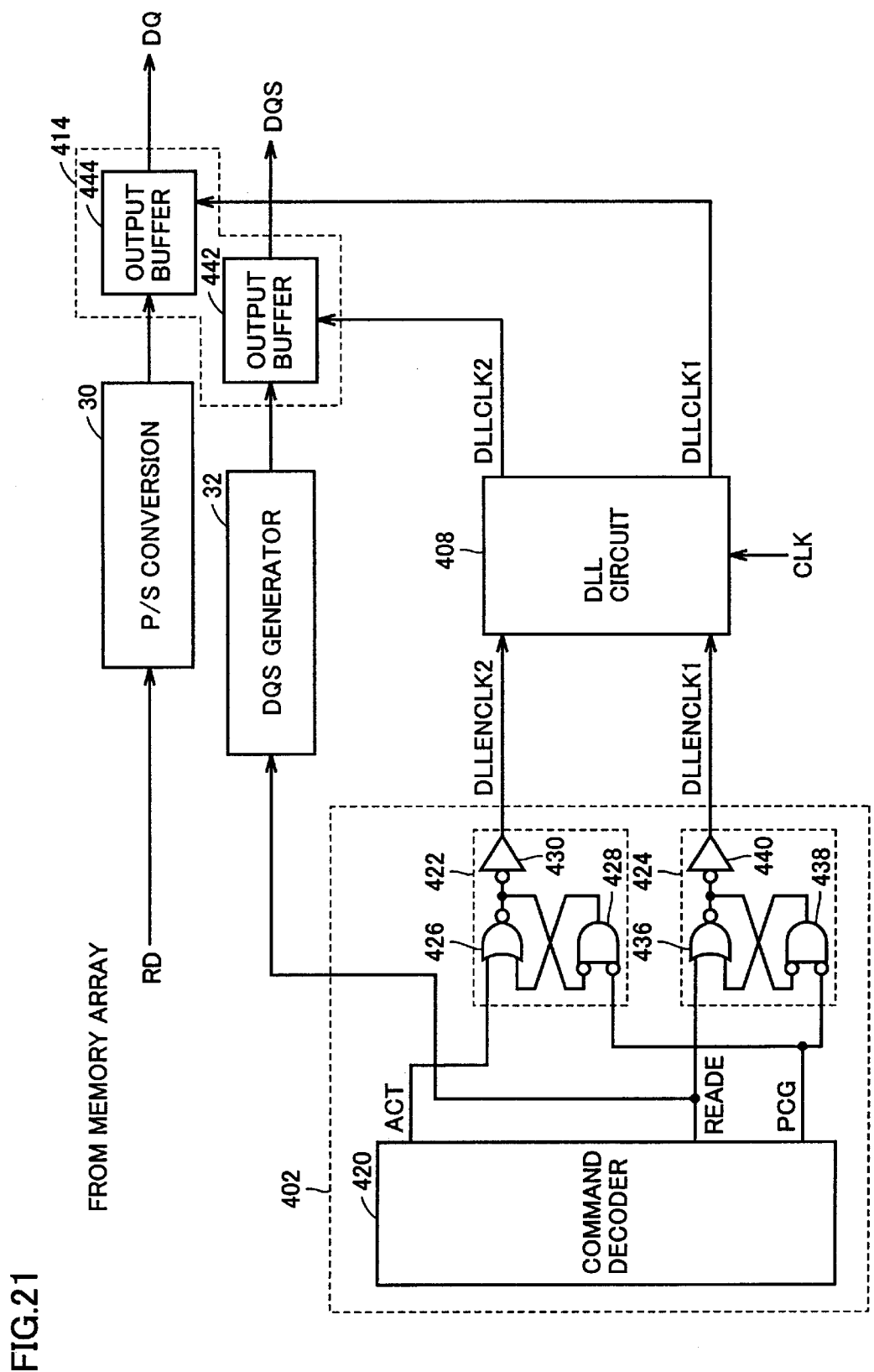
FIG. 21 is a circuit diagram showing the configuration of a control logic 402 and an output circuit 414 used in the sixth embodiment.

FIG. 21 is a circuit diagram showing the configuration of a control logic 402 and an output circuit 414 used in the sixth embodiment.

Referring to FIG. 21, the semiconductor memory device according to the sixth embodiment includes, in the configuration of semiconductor memory device 1 shown in FIG. 1, a control logic 402 in place of control logic 2, a DLL circuit 408 in place of DLL circuit 8, and an output circuit 414 in place of output circuit 34. The configuration of the other parts of the semiconductor memory device according to the sixth embodiment is similar to that of semiconductor memory device 1, so that the description thereof will not be repeated.

Control logic 402 includes a command decoder 420 receiving and decoding a control signal and outputting signals ACT, READE and PCG, a latch circuit 422 set in accordance with signal ACT and reset in accordance with signal PCG, a latch circuit 424 set in accordance with signal READE and reset in accordance with signal PCG.

Latch circuit 422 includes an NOR circuit 426 receiving a signal ACT at one input thereof, and an NOR circuit 428 receiving an output of NOR circuit 426 and signal PCG, and an inverter 430 receiving and inverting an output of NOR circuit 428, and outputting a control signal DLLENCLK2. It is noted that the other input of NOR circuit 426 receives the output of NOR circuit 428.

Latch circuit 424 includes an NOR circuit 436 receiving signal READE at one input thereof, an NOR circuit 438 receiving an output of NOR circuit 436 and signal PCG, and an inverter 440 receiving and inverting an output of NOR circuit 438 and outputting a control signal DLLENCLK1. It is noted that the other input of NOR circuit 436 receives the output of NOR circuit 438.

DLL circuit 408 delays the CLK signal, and outputs clock signals DLLCLK1 and DLLCLK2, in response to control signals DLLENCLK1 and DLLENCLK2 being activated, respectively.

When a read command is externally applied, read data RD is read from a memory array to P/S conversion circuit 30. Signal READE output from the command decoder is applied to a DQS generator 32.

Output circuit 414 includes an output buffer 444 receiving the read data converted by P/S conversion circuit 30 and outputting a data output signal DQ in synchronization with DLLCLK1, and an output buffer 442 receiving an output of the DQS generator and outputting a data strobe signal DQS in synchronization with DLLCLK2.

Figure 22:
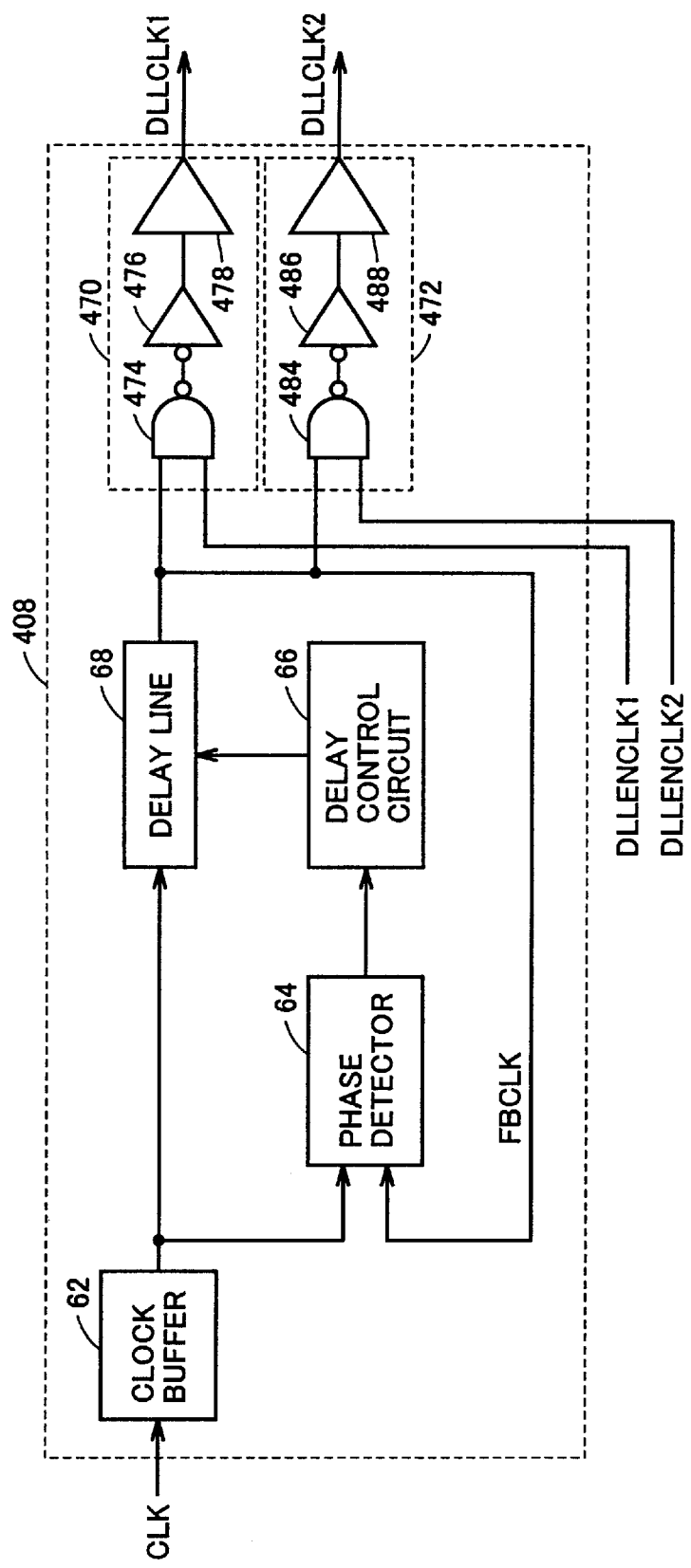
FIG. 22 is a circuit diagram showing the configuration of a DLL circuit 408 in FIG. 21.

FIG. 22 is a circuit diagram showing the configuration of DLL circuit 408 in FIG. 21.

Referring to FIG. 22, DLL circuit 408 includes clock driving circuits 470 and 472 in place of clock driving circuit 70 in the configuration of DLL circuit 8 described with reference to FIG. 3.

Clock driving circuit 470 includes an NAND circuit 474 receiving clock signal FBCLK and control signal DLLENCLK1, an inverter 476 receiving and inverting an output of NAND circuit 474, and a buffer circuit 478 amplifying an output of inverter 476 and outputting clock signal DLLCLK1.

Clock driving circuit 472 includes an NAND circuit 484 receiving clock signal FBCLK and control signal DLLENCLK2, an inverter 486 receiving and inverting an output of NAND circuit 484, and a buffer circuit 488 amplifying an output of inverter 486 and outputting clock signal DLLCLK1.

Figure 23:
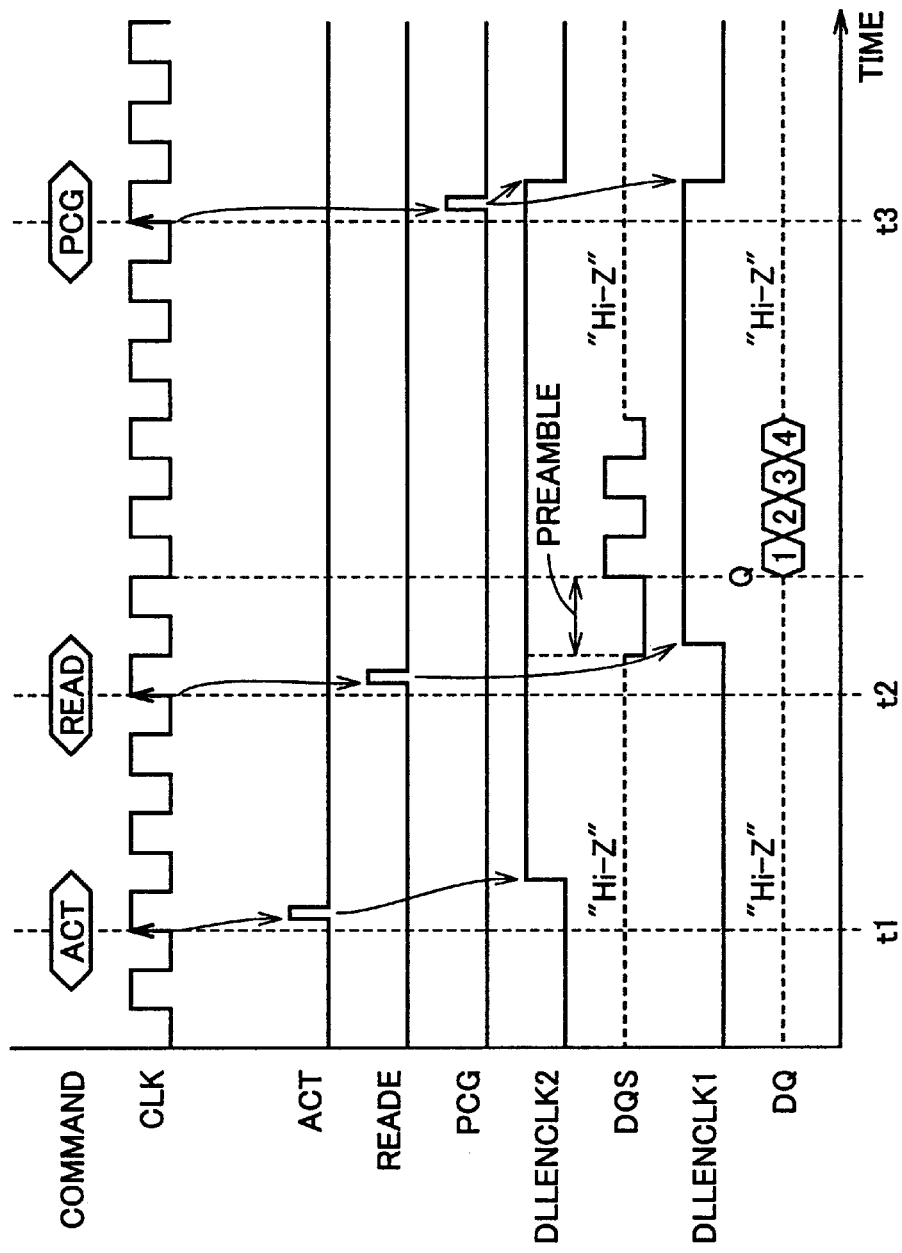
FIG. 23 is an operation waveform illustrating the operation of a semiconductor memory device according to the sixth embodiment.

FIG. 23 is an operation waveform illustrating the operation of the semiconductor memory device according to the sixth embodiment.

Referring to FIGS. 21 and 23, data strobe signal DQS must be activated earlier than data read signal DQ by a preamble period. In other words, output buffer 442 outputting data strobe signal DQS must be supplied with synchronizing clock DLLCLK2 at an early time point, whereas output buffer 444 outputting data read signal DQ may be supplied with synchronizing clock signal DLLCLK1 at a time point later than the time point described above.

Thus, when command ACT is input at time t1, control signal DLLENCLK2 is accordingly activated, and clock signal DLLCLK2 is supplied to output buffer 442. This is because, if command READ at time t2 is used as a trigger, the margin will be too small for data strobe signal DQS to be normally output on time.

Subsequently, control signal DLLENCLK1 is activated in response to the input of command READ at time t2, and clock signal DLLCLK1 is supplied to output buffer 444. The time at which output of data reading signal DQ is commenced may be later than the time at which output of the date strobe signal is commenced by the period of preamble, providing a margin of the length of that period.

When command PCG is input at time t3, both latch circuits 422 and 424 are reset, and control signals DLLENCLK1 and DLLENCLK2 are both set to be at the L level. As a result, clock signals DLLCLK1 and DLLCLK2 are stopped being supplied to output buffers 444 and 442.

Thus, when the clock is used in a plurality of circuits and divided into circuit groups, each of which requires a different clock-supplying period, the clock driving circuit at the output portion of the DLL circuit is provided in a plural number corresponding to the number of the circuit groups. If the size of each clock driving circuit is made appropriate according to a driving load and is activated in response to the timing at which a clock signal is required, further reduction of power consumption can be allowed.

Although the present invention has been described and illustrated in detail, it is clearly understood that the same is by way of illustration and example only and is not to be taken by way of limitation, the spirit and scope of the present invention.

What is claimed is:

1. A semiconductor memory device, comprising:
   a memory array including memory cells arranged in a matrix of rows and columns;
   a first output circuit outputting a first output signal to outside the semiconductor memory device in synchronization with a first clock signal, in response to data reading from said memory array;

a DLL circuit receiving and delaying an external clock signal and generating said first clock signal; and a control circuit making said DLL circuit activate said first clock signal in accordance with a control signal from outside the semiconductor memory device;

wherein said control circuit includes a command decode circuit decoding said control signal and detecting a plurality of commands, and said control circuit makes said DLL circuit activate said first clock signal in accordance with a first command of said plurality of commands, and makes said DLL circuit inactivate said first clock signal in accordance with a second command of said plurality of commands.

2. The semiconductor memory device according to claim 1, wherein said plurality of commands include a row activation command, a row inactivation command, and a read command, and said control circuit further includes
- a mode register holding latency information from reception of said read command until said read data starts being output to outside the semiconductor memory device,
- a selecting unit selecting any one of said row activation command and said read command as said first command in accordance with said latency information, and
- a latch circuit set in accordance with an output of said selecting unit and reset in accordance with said row inactivation command.

3. A semiconductor memory device, comprising:

a memory array including memory cells arranged in a matrix of rows and columns;

a first output circuit outputting a first output signal to outside the semiconductor memory device in synchronization with a first clock signal, in response to data reading from said memory array;

a DLL circuit receiving and delaying an external clock signal and generating said first clock signal; and a control circuit making said DLL circuit activate said first clock signal in accordance with a control signal from outside the semiconductor memory device;

wherein said DLL circuit includes
- a delay line receiving said external clock signal and delaying the received signal for delay time according to a delay control signal,
- a phase detector detecting a phase difference between an output of said delay line and said external clock signal,
- a delay control circuit outputting said delay control signal in accordance with an output of said phase detector, and
- a first clock driving circuit activated in response to a first enable signal, to receive an output of said delay line and to output said first clock signal.

4. A semiconductor memory device, comprising:

a memory array including memory cells arranged in a matrix of rows and columns;

a first output circuit outputting a first output signal to outside the semiconductor memory device in synchronization with a first clock signal, in response to data reading from said memory array;

a DLL circuit receiving and delaying an external clock signal and generating said first clock signal; and a control circuit making said DLL circuit activate said first clock signal in accordance with a control signal from outside the semiconductor memory device;

wherein said control circuit includes a command decode circuit decoding said control signal and detecting a plurality of commands, and said control circuit makes said DLL circuit activate said first clock signal in accordance with a first command of said plurality of commands, and makes said DLL circuit inactivate said first clock signal after a predetermined period needed for an operation according to said first command to be completed.

5. The semiconductor memory device according to claim 4, wherein said plurality of commands include a read command, and said control circuit includes
- a mode register holding latency information from reception of said read command until said read data starts being output to outside the semiconductor memory device, and a burst length indicating the number of sequentially-output said read data,
- a column selection control circuit outputting a column selection period signal in accordance with said read command for a period determined by said latency information and said burst length, and
- a timing delay circuit delaying a non-selection time point of said column selection period signal for a predetermined time.

6. The semiconductor memory device according to claim 5, wherein said timing delay circuit includes
- a shift register receiving said column selection period signal and delaying the signal by the number of clocks corresponding to said predetermined time, and
- an OR circuit outputting a logical sum of an output of said shift register and said column selection signal.

7. The semiconductor memory device according to claim 5, wherein said timing delay circuit includes
- a plurality of delay circuits connected in series, to receive and delay said column selection period signal, and
- an OR circuit outputting a logical sum of outputs of said plurality of delay circuits and said column selection signal.

8. A semiconductor memory device, comprising:

a memory array including memory cells arranged in a matrix of rows and columns;

a first output circuit outputting a first output signal to outside the semiconductor memory device in synchronization with a first clock signal, in response to data reading from said memory array;

a DLL circuit receiving and delaying an external clock signal and generating said first clock signal; and a control circuit making said DLL circuit activate said first clock signal in accordance with a control signal from outside the semiconductor memory device;

wherein said control signal includes an enable signal of said external clock signal, and said control circuit makes said DLL circuit inactivate said first clock signal when said enable signal is inactivated for at least a predetermined period.

9. The semiconductor memory device according to claim 8, wherein said control circuit includes
- a shift register receiving said enable signal and delaying the received signal by the number of clocks corresponding to first to third predetermined time, respectively, to output first to third delay signals, and an OR circuit outputting a logical sum of said first to third delay signals.

10. A semiconductor memory device, comprising:
a memory array including memory cells arranged in a matrix of rows and columns;
a first output circuit outputting a first output signal to outside the semiconductor memory device in synchronization with a first clock signal, in response to data reading from said memory array;
a DLL circuit receiving and delaying an external clock signal and generating said first clock signal; and
a control circuit making said DLL circuit activate said first clock signal in accordance with a control signal from outside the semiconductor memory device;
wherein said first output signal is a data strobe signal corresponding to read data read from said memory array.

11. A semiconductor memory device, comprising:
a memory array including memory cells arranged in a matrix of rows and columns;
a first output circuit outputting a first output signal to outside the semiconductor memory device in synchronization with a first clock signal, in response to data reading from said memory array;
a DLL circuit receiving and delaying an external clock signal and generating said first clock signal; and
a control circuit making said DLL circuit activate said first clock signal in accordance with a control signal from outside the semiconductor memory device; and
a second output circuit outputting, in synchronization with a second clock signal, a strobe signal corresponding to read data read from said memory array,
said DLL circuit activating said first clock signal after starting activation of said second clock signal.

12. The semiconductor memory device according to claim 11, wherein
said control circuit includes a command decode circuit decoding said control signal and detecting a plurality of commands, and
said control circuit makes said DLL circuit activate said second clock signal in accordance with a first command of said plurality of commands, and makes said DLL circuit activate said first clock signal in accordance with a second command of said plurality of commands.

13. The semiconductor memory device according to claim 12, wherein
said plurality of commands include a row activation command, a row inactivation command and a read command; and
said control circuit further includes
a first latch circuit set in accordance with said row activation command and reset in accordance with said row inactivation command, and
second latch circuit set in accordance with said read command and reset in accordance with said row inactivation command.

14. The semiconductor memory device according to claim 11, wherein
said control circuit outputs first and second enable signals; and
said DLL circuit includes
a delay line receiving said external clock signal and delaying for delay time according to a delay control signal,
a phase detector detecting a phase difference between an output of said delay line and said external clock signal,
a delay control circuit outputting said delay control signal in accordance with an output of said phase detector,
a first clock driving circuit activated in accordance with said first enable signal, to receive an output of said delay line and to output said first clock signal, and
a second clock driving circuit activated in accordance with said second enable signal, to receive an output of said delay line and to output said second clock signal.

15. A semiconductor memory device, comprising:
a memory array including memory cells arranged in a matrix of rows and columns;
a data output circuit receiving read data from said memory array and outputting the read data to outside the semiconductor memory device in synchronization with an internal clock signal; and
a DLL circuit receiving and delaying an external clock signal to generate said internal clock signal,
said DLL circuit including
a delay line receiving said external clock signal and delaying the received signal for delay time according to a delay control signal,
a phase detector detecting a phase difference between an output of said delay line and said external clock signal,
a delay control circuit outputting said delay control signal in accordance with an output of said phase detector, and
a clock driving circuit activated in accordance with the output of said phase detector, to receive an output of said delay line and to output said internal clock signal.

16. The semiconductor memory device according to claim 15, wherein
said clock driving circuit outputs said internal clock signal when said phase detector detects that said phase difference has come to be smaller than a predetermined value.

* * * * *